(12) United States Patent
Aketa et al.

(10) Patent No.: US 9,997,685 B2
(45) Date of Patent: Jun. 12, 2018

(54) LIGHT-EMITTING DEVICE

(71) Applicant: PANASONIC INTELLECTUAL PROPERTY MANAGEMENT CO., LTD., Osaka (JP)

(72) Inventors: Takanori Aketa, Osaka (JP); Mitsuhiko Ueda, Osaka (JP); Toru Hirano, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 14/916,308

(22) PCT Filed: Sep. 3, 2014

(86) PCT No.: PCT/JP2014/004513
§ 371 (c)(1),
(2) Date: Mar. 3, 2016

(87) PCT Pub. No.: WO2015/033557
PCT Pub. Date: Mar. 12, 2015

(65) Prior Publication Data
US 2016/0218262 A1    Jul. 28, 2016

(30) Foreign Application Priority Data

Sep. 5, 2013  (JP) .................. 2013-184296
Oct. 11, 2013  (JP) .................. 2013-213982

(51) Int. Cl.
*H01L 33/62* (2010.01)
*H01L 23/00* (2006.01)
*H01L 33/38* (2010.01)
*H01L 33/44* (2010.01)
(Continued)

(52) U.S. Cl.
CPC .............. *H01L 33/62* (2013.01); *H01L 24/14* (2013.01); *H01L 33/22* (2013.01); *H01L 33/38* (2013.01);
(Continued)

(58) Field of Classification Search
None
See application file for complete search history.

(56) References Cited

U.S. PATENT DOCUMENTS

2003/0111727 A1   6/2003  Kurusu
2005/0104220 A1*  5/2005  Tsuchiya ................ H01L 24/10
                                              257/774
(Continued)

FOREIGN PATENT DOCUMENTS

JP    H07-263754    10/1995
JP    2002-057374    2/2002
(Continued)

OTHER PUBLICATIONS

International Search Report, dated Oct. 7, 2014, in corresponding International Patent Application No. PCT/JP2014/004513.

*Primary Examiner* — Matthew Reames
*Assistant Examiner* — Steven B Gauthier
(74) *Attorney, Agent, or Firm* — Greenblum & Bernstein, P.L.C.

(57) ABSTRACT

Light emitting device includes structure protruding from a side of a surface of second conductive semiconductor layer of LED chip toward a side of a surface of second conductor portion of mounting substrate to contact the surface of second conductor portion, and is positioned to extend around an outer periphery of second electrode. First electrode and a first conductor portion are joined to each other by first joint portion, and second joint portion joining second electrode and second conductor portion to each other fills a
(Continued)

space surrounded by second electrode, protruding structure, and second conductor portion. Protruding structure is disposed to extend around the outer periphery of second electrode to surround second joint portion in planar view. A part of mounting substrate overlapping protruding structure in planar view is either identical in height to or lower than a part of second conductor portion joined to second joint portion.

9 Claims, 24 Drawing Sheets

(51) Int. Cl.
- *H01L 33/22* (2010.01)
- *H01L 33/48* (2010.01)
- *H01L 33/20* (2010.01)
- *H01L 33/64* (2010.01)

(52) U.S. Cl.
CPC ............ *H01L 33/44* (2013.01); *H01L 33/486* (2013.01); *H01L 33/20* (2013.01); *H01L 33/641* (2013.01); *H01L 2924/01322* (2013.01); *H01L 2933/0066* (2013.01)

(56) References Cited

U.S. PATENT DOCUMENTS

| | | |
|---|---|---|
| 2005/0168992 A1 | 8/2005 | Hirose |
| 2007/0145554 A1 | 6/2007 | Tsuchiya et al. |
| 2008/0310854 A1 | 12/2008 | Takai et al. |
| 2010/0051995 A1 | 3/2010 | Katsuno et al. |
| 2010/0117114 A1 | 5/2010 | Suzuki et al. |
| 2011/0297989 A1 | 12/2011 | Murai et al. |
| 2013/0146646 A1 | 6/2013 | Suzuki et al. |
| 2013/0146914 A1 | 6/2013 | Katsuno et al. |
| 2013/0146930 A1* | 6/2013 | Toda .................. C09K 11/7792 257/98 |
| 2014/0097462 A1 | 4/2014 | Suzuki et al. |
| 2015/0056729 A1 | 2/2015 | Katsuno et al. |

FOREIGN PATENT DOCUMENTS

| | | | | |
|---|---|---|---|---|
| JP | 2002-359427 | | 12/2002 | |
| JP | 2002359427 A | * | 12/2002 | ........... H01L 23/492 |
| JP | 2003-046142 | | 2/2003 | |
| JP | 2003-188507 | | 7/2003 | |
| JP | 2004-103975 | | 4/2004 | |
| JP | 2005-150386 | | 6/2005 | |
| JP | 2005-203448 | | 7/2005 | |
| JP | 2008-053423 | | 3/2008 | |
| JP | 2010-056323 | | 3/2010 | |
| JP | 2010-118543 | | 5/2010 | |
| JP | 2010-199247 | | 9/2010 | |
| JP | 2011-204838 | | 10/2011 | |
| JP | 2012-019153 | | 1/2012 | |
| JP | 2013-008822 | | 1/2013 | |
| JP | 2013-038151 | | 2/2013 | |
| JP | 2013-084705 | | 5/2013 | |

* cited by examiner

LIGHT-EMITTING DEVICE

TECHNICAL FIELD

The present invention relates to a light emitting device that includes an LED chip (a light emitting diode chip).

BACKGROUND ART

A light emitting device 100 having the configuration shown in FIG. 32, for example, is known as a light emitting device (see JP 2010-199247 A).

The light emitting device 100 includes an LED chip 101 and a mounting substrate 102 on which the LED chip 101 is mounted.

The LED chip 101 includes, on one surface side of a translucent substrate 111, a laminated structure including an n-type nitride semiconductor layer 112, a nitride light emitting layer 113, and a p type nitride semiconductor layer 114. Regarding the LED chip 101, an anode electrode 107 is formed on an opposite side of the p-type nitride semiconductor layer 114 to the nitride light emitting layer 113. Further, regarding the LED chip 101, a cathode electrode 108 is formed on a side of the n-type nitride semiconductor layer 112 on which the nitride light emitting layer 113 is laminated.

Regarding the mounting substrate 102, conductive patterns 127, 128 are formed on one surface side of an insulating substrate 121. The anode electrode 107 of the LED chip 101 is joined to the conductive pattern 127 via a plurality of bumps 137. Further, the cathode electrode 108 of the LED chip 101 is joined to the conductive pattern 128 via a single bump 138.

An LED device (a semiconductor light emitting device) 210 having the configuration shown in FIG. 33, for example, is also known as a light emitting device (see JP 2011-204838 A).

The LED device 210 includes a circuit board 212 and an LED element 213 that is mounted on the circuit board 212 by flip-chip mounting.

A −electrode 214 (a first electrode) and a +electrode 215 (a second electrode) are formed on a plate material 216 of the circuit board 212.

The LED element 213 includes a sapphire substrate 225, an n-type semiconductor layer 221 (a first conductor layer), a light emitting layer (not shown), and a p-type semiconductor layer 222 (a second semiconductor layer). The LED element 213 also includes an n-side bump 223 (a first bump) connected to the n-type semiconductor layer 221, and a p-side bump 224 (a second bump) connected to the p-type semiconductor layer 222. The n-side bump 223 has a smaller surface area than the p-side bump 224. Each of the n-side bump 223 and the p-side bump 224 is constituted by an Au bump portion and a gold-tin eutectic layer. The n-side bump 223 and the p-side bump 224 each have a thickness between 10 and 15 µm. A thickness of the gold-tin eutectic layer is between 2 and 3 µm. A step of approximately 1 µm, which corresponds to a thickness of the p-type semiconductor layer 222, is provided between respective lower surfaces of the n-side bump 223 and the p-side bump 224.

The n-side bump 223 and the p-side bump 224 of the LED element 213 are connected respectively to the −electrode 214 and the +electrode 215 of the circuit board 212. A correction film 217 is formed on the −electrode 214 of the circuit board 212 in a connection region where the −electrode 214 is connected to the n-side bump 223. The correction film 217 is formed at a substantially equal thickness (approximately 1 µm) to the aforesaid step.

By providing the LED device 210 with the correction film 217, an amount of gold-tin alloy protruding from a connection region of the p-side bump 224 can be reduced. Further, in the LED device 210, there is no need to press down the p-side bump 224 excessively during a joining process for mounting the LED element 213 on the circuit board 212, and therefore an amount of pressure applied during the joining process can be reduced in comparison with a case where the correction film 217 is not provided.

SUMMARY OF THE INVENTION

Technical Problem

In the field of light emitting devices, there is demand for achieving an improvement in reliability by improving the radiation performance.

In the light emitting device 100, however, it is difficult to achieve a further reduction in thermal resistance between the LED chip 101 and the mounting substrate 102.

Further, in the joining process performed during manufacture of the LED device 210, the respective gold-tin eutectic layers of the n-side bump 223 and the p-side bump 224 must be melted by applying pressure from the LED element 213 side and heat from the circuit board 212 side after positioning the circuit board 212 and the LED element 213. In the LED device 210, therefore, the respective thicknesses of the n-side bump 223 and the p-side bump 224 are likely to vary, leading to an increase in the likelihood of variation in the thermal resistance.

The present invention has been designed in consideration of the circumstances described above, and an object thereof is to provide a light emitting device with which thermal resistance between an LED chip and a mounting substrate can be reduced.

Solution to Problem

A light emitting device according to the present invention includes a mounting substrate and an LED chip mounted on the mounting substrate. The mounting substrate includes: a support; and a first conductor portion and a second conductor portion that are supported by the support such that the LED chip is electrically connected thereto. The LED chip includes: a substrate; a first conductive semiconductor layer formed on a side of a first surface of the substrate; and a second conductive semiconductor layer formed on an opposite side of the first conductive semiconductor layer to the substrate. The LED chip also includes: a first electrode formed on a surface of the first conductive semiconductor layer that is exposed to an opposite side to the substrate; and a second electrode formed on a surface of the second conductive semiconductor layer. The light emitting device according to the present invention further includes a protruding structure that protrudes from a side of the surface of the second conductive semiconductor layer toward a side of a surface of the second conductor portion so as to contact the surface of the second conductor portion, and is positioned so as to extend around an outer periphery of the second electrode. In the light emitting device according to the present invention, the first electrode and the first conductor portion are joined to each other by a first joint portion formed from solder, and the second electrode and the second conductor portion are joined to each other by a second joint portion formed from solder. The second joint portion is formed so as to fill a space surrounded by the second electrode, the protruding structure, and the second conductor portion. The protruding structure is disposed to extend around the outer periphery of the second electrode so as to surround the second joint portion in planar view. A part of the mounting substrate that overlaps the protruding structure in planar view is either identical in height to or lower than a part of the second conductor portion that is joined to the second joint portion.

With the light emitting device according to the present invention, thermal resistance between the LED chip and the mounting substrate can be reduced.

DESCRIPTION OF EMBODIMENTS

First Embodiment

Figure 1:
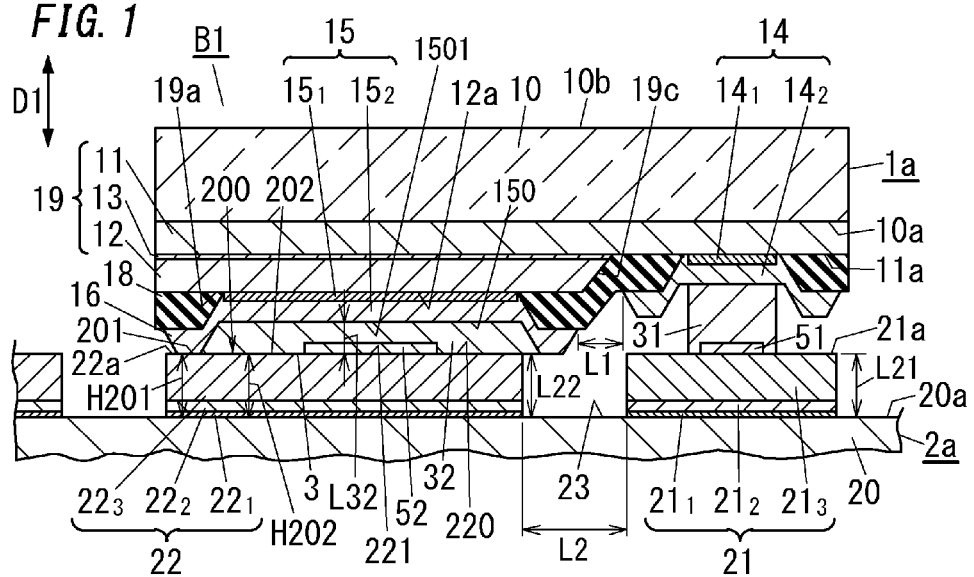
FIG. 1 is a schematic sectional view showing main parts of a light emitting device according to a first embodiment.
Figure 2:
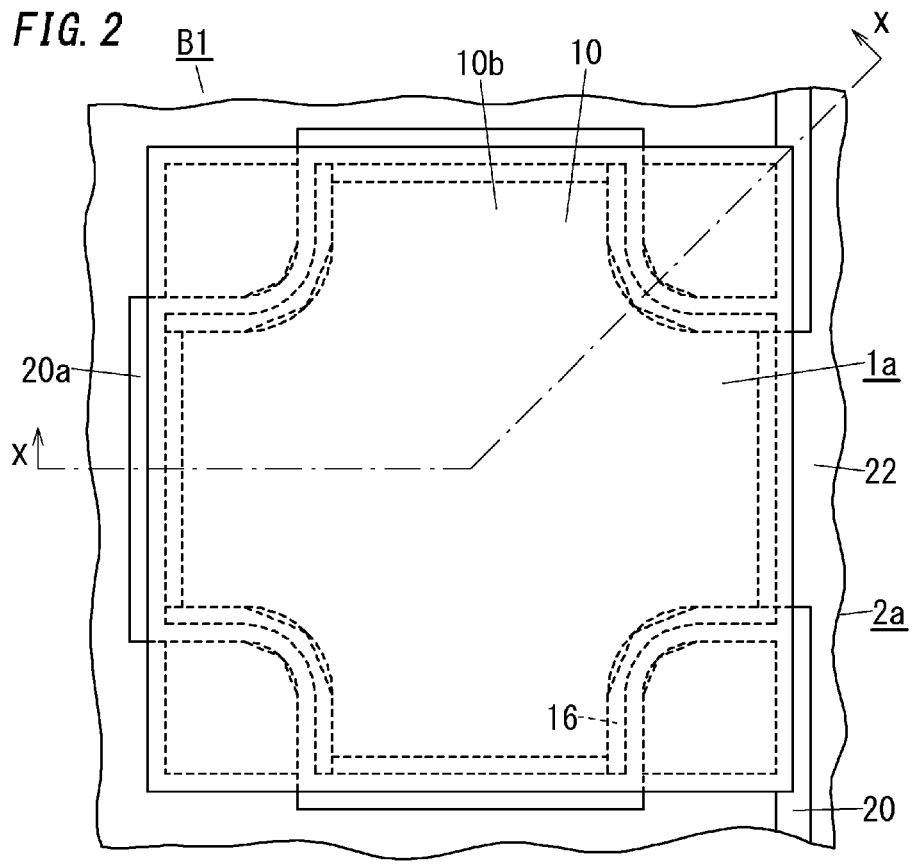
FIG. 2 is a schematic plan view showing the main parts of the light emitting device according to the first embodiment.

A light emitting device B1 according to this embodiment will be described below on the basis of FIGS. 1 to 6. Note that FIG. 1 is a pattern-form schematic sectional view corresponding to an X-X cross-section of FIG. 2.

The light emitting device B1 includes a mounting substrate 2a and an LED chip 1a mounted on the mounting substrate 2a. The mounting substrate 2a includes a support 20, and a first conductor portion 21 and a second conductor portion 22 that are supported by the support 20 such that the LED chip 1a is electrically connected thereto. The LED chip 1a includes a substrate 10, a first conductive semiconductor layer 11 formed on a side of a first surface 10a of the substrate 10, and a second conductive semiconductor layer 12 formed on an opposite side of the first conductive semiconductor layer 11 to the substrate 10. The LED chip 1a also includes a first electrode 14 formed on a surface 11a of the first conductive semiconductor layer 11 that is exposed to an opposite side to the substrate 10, and a second electrode 15 formed on a surface 12a of the second conductive semiconductor layer 12. Further, the light emitting device B1 includes a protruding structure 16 that protrudes from one of a side of the surface 12a of the second conductive semiconductor layer 12 and a side of a surface 22a of the second conductor portion 22 toward the other side so as to contact the other side, and is positioned so as to extend around an outer periphery of the second electrode 15. More specifically, the protruding structure 16 of the light emitting device B1 protrudes from the side of the surface 12a of the second conductive semiconductor layer 12 of the LED chip 1a toward the side of the surface 22a of the second conductor portion 22 of the mounting substrate 2a so as to contact the surface 22a of the second conductor portion 22, and is positioned so as to extend around the outer periphery of the second electrode 15. The protruding structure 16 also protrudes further on the side of the surface of the second conductive semiconductor layer 12 than a central portion 1501 of the surface 150 of the second electrode 15. On the mounting substrate 2a, the respective thicknesses L21, L22 of the first conductor portion 21 and the second conductor portion 22 are greater than an interval L32 between the central portion 1501 of the surface 150 of the second electrode 15 and a central portion 221 of the surface 220 of the second conductor portion 22. Additionally, the mounting substrate 2a has a surface 200 facing to the LED chip 1a, the surfacing 200 having a first part 201 and a second part 202. The first part 201 overlaps the protruding structure in a thickness direction D1 of the LED chip 1a, the first part 201 having a first height H201 from the support 20. The second part 202 of the second conduction portion 22 being jointed to the second joint portion 32, the second part 202 having a second height H202 from the support 20. The first height H201 is equal to or lower than the second height H202. Furthermore, in the light emitting device B1, the first electrode 14 and the first conductor portion 21 are joined to each other by a first joint portion 31 formed from solder, while the second electrode 15 and the second conductor portion 22 are joined to each other by a second joint portion 32 formed from solder. The second joint portion 32 is formed so as to fill a space 3 surrounded by the second electrode 15, the protruding structure 16, and the second conductor portion 22. The protruding structure 16 is disposed to extend around the outer periphery of the second electrode 15 so as to surround the second joint portion 32 in planar view. A part of the mounting substrate 2a that overlaps the protruding structure 16 in planar view is either identical in height to or lower than a part of the second conductor portion 22 that is joined to the second joint portion 32. Hence, in the light emitting device B1, the first joint portion 31 and the second joint portion 32 can be respectively reduced in thickness, and moreover, the first joint portion 31 and the second joint portion 32 can respectively be joined to the first conductor portion 21 and the second conductor portion 22 by surface joints. As a result, thermal resistance in the light emitting device B1 between the LED chip 1a and the mounting substrate 2a can be reduced. Furthermore, in the light emitting device B1, the thickness of the second joint portion 32 can be managed using the protruding structure 16, and therefore the thickness and size of the second joint portion 32 can be set more precisely, enabling reductions in the thermal resistance and variation in the thermal resistance. Moreover, in the light emitting device B1, the thickness of the second joint portion 32 can be determined in accordance with the thickness of the protruding structure 16 alone, and therefore variation in the thickness of the second joint portion 32 can be suppressed more effectively than when a projection is provided on the part of the mounting substrate 2a that overlaps the protruding structure 16, enabling a reduction in variation in the thermal resistance. In short, with the light emitting device B1, variation in the thermal resistance among finished products can be reduced. As a result, improvements in the radiation performance and reliability of the light emitting device B1 can be achieved. The expression "the protruding structure 16 in planar view" means that the protruding structure 16 is seen from a thickness direction of the protruding structure 16, which corresponds to a thickness direction of the LED chip 1a.

Preferably, the protruding structure 16 is formed so as to extend around the outer periphery of the second electrode 15 of the LED chip 1a, and protrudes further on the side of the surface 12a of the second conductive semiconductor layer 12 than a periphery thereof on the LED chip 1a. As a result, the light emitting device B1 can be configured such that the protruding structure 16 contacts the surface 22a of the second conductor portion 22, and such that the second joint portion 32 is formed so as to fill the space 3 surrounded by the second electrode 15, the protruding structure 16, and the second conductor portion 22.

The mounting substrate 2a of the light emitting device B1 is preferably configured such that a surface of the part of the second conductor portion 22 that overlaps the protruding structure 16 is flush with a surface of the part of the second conductor portion 22 that is joined to the second joint portion 32. Hence, in the light emitting device B1, the thickness of the second joint portion 32 can be determined in accordance with the thickness of the protruding structure 16 alone, and therefore variation in the thickness of the second joint portion 32 can be suppressed more effectively than when a projection is provided on the part of the second conductor portion 22 of the mounting substrate 2a that overlaps the protruding structure 16, enabling variation in the thermal resistance can be reduced. Moreover, the second joint portion 32 of the light emitting device B1 can be reduced in thickness, enabling an improvement in the radiation performance.

Preferably, only the first joint portion 31 is interposed between the LED chip 1a and the first conductor portion 21. In so doing, the thickness and size of the second joint portion 32 of the light emitting device B1 can be set more precisely, enabling further reductions in the thermal resistance and variation in the thermal resistance.

AuSn is preferably used as the solder forming the first joint portion 31 and the solder forming the second joint portion 32. In so doing, an improvement in heat resistance can be achieved in comparison with a case where SnCuAg, for example, which is a type of lead-free solder other than AuSn, is employed as the solder forming the first joint portion 31 and the solder forming the second joint portion 32. Hence, when the light emitting device B1 is secondarily mounted on a printed wiring board or the like, for example, re-melting of the first joint portion 31 and the second joint portion 32 during secondary mounting can be suppressed.

The solder forming the first joint portion 31 and the solder forming the second joint portion 32 are not limited to AuSn, and any of AuSn, SnAgCu, AuGe, AuSi, PbSn, and so on, for example, may be used.

In this specification, for convenience, the respective constituent elements of the light emitting device B1 will be described in detail after describing a method of manufacturing the light emitting device B1.

In the method of manufacturing the light emitting device B1 according to this embodiment, first, the LED chip 1a and the mounting substrate 2a are prepared, whereupon first and second processes are performed in sequence.

Figure 3:
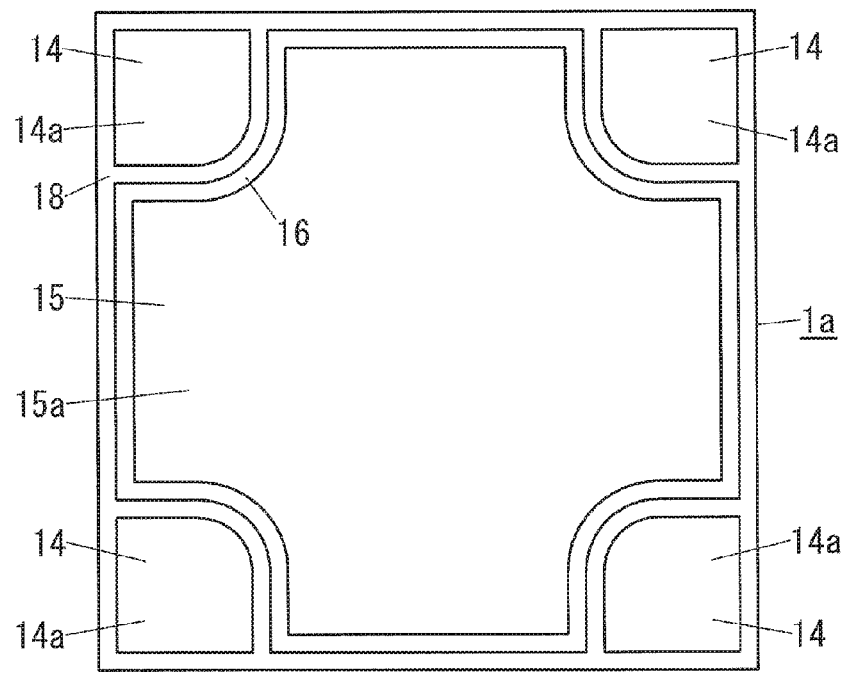
FIG. 3 is a schematic plan view showing an LED chip of the light emitting device according to the first embodiment.
Figure 4:
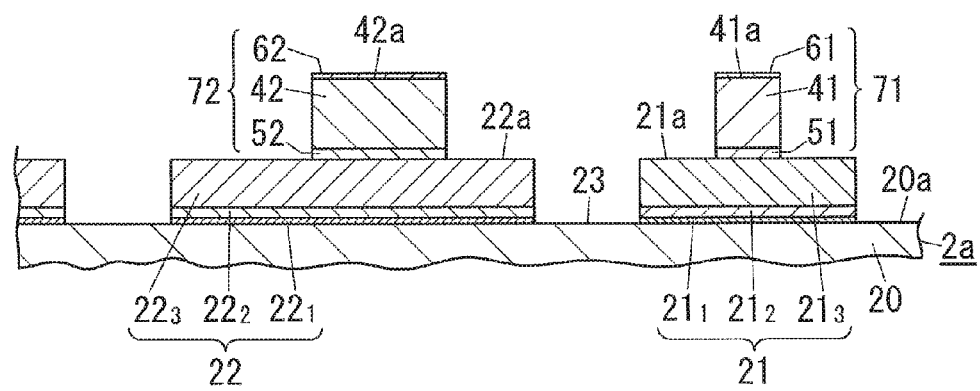
FIG. 4 is an illustrative view showing a method of manufacturing the light emitting device according to the first embodiment.
Figure 5:
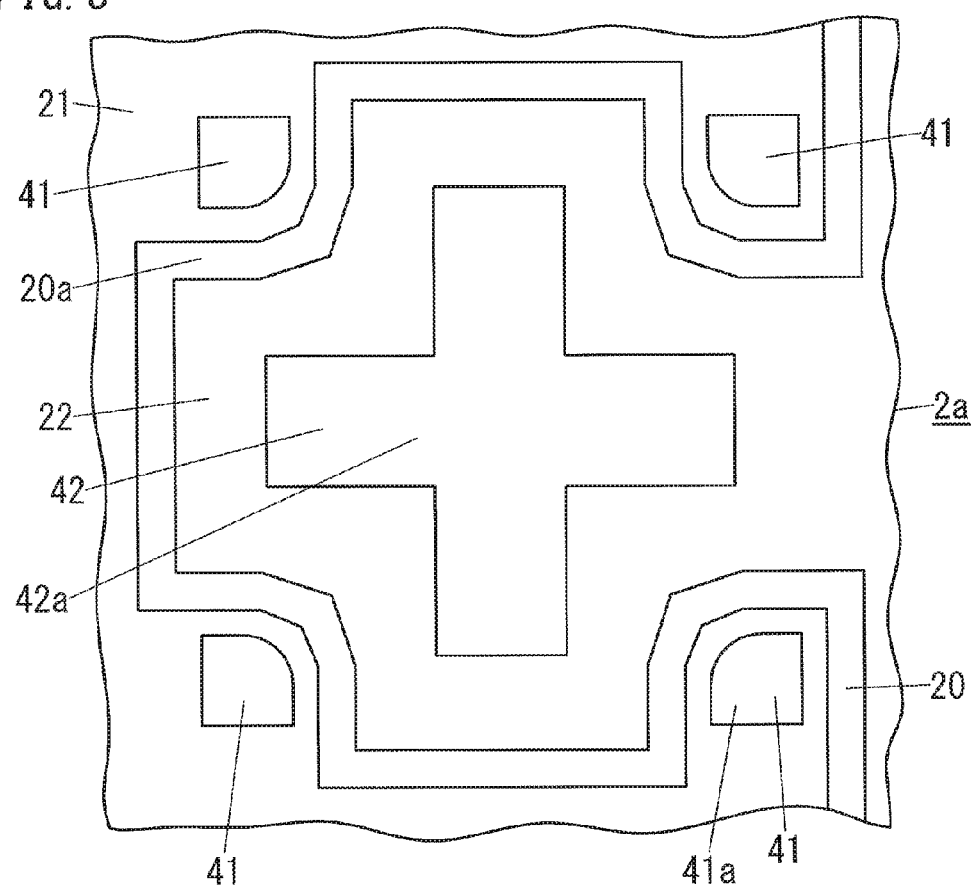
FIG. 5 is an illustrative view showing the method of manufacturing the light emitting device according to the first embodiment.

In the first process, as shown in FIGS. 4 and 5, a first solder layer 41 and a second solder layer 42 serving respectively as bases of the first joint portion 31 and the second joint portion 32 are formed on the mounting substrate 2a on the side of the surface 21a of the first conductor portion 21 and the side of the surface 22a of the second conductor portion 22, respectively. AuSn, for example, may be employed as the solder serving as the material of the first solder layer 41 and the second solder layer 42. The first solder layer 41 and the second solder layer 42 may be formed by a vapor deposition method, a plating method, or the like, for example. In the first process, respective thicknesses of the first solder layer 41 and the second solder layer 42 are set at identical values. A surface area of a surface 41a of the first solder layer 41 is set to be smaller than a surface area of a surface 14a (see FIG. 3) of the first electrode 14. Further, a surface area of a surface 42a of the second solder layer 42 is set to be smaller than a surface area of a surface 15a (see FIG. 3) of the second electrode 15. The respective thicknesses of the first solder layer 41 and the second solder layer 42 are set to exceed, by a predetermined thickness ($\alpha$), a sum (H1+H2) of a protrusion amount H1 (see FIG. 6) of the protruding structure 16 of the LED chip 1a and a step H2 (see FIG. 6) between the second electrode 15 and the first electrode 14 in the thickness direction of the LED chip 1a. In other words, the respective thicknesses of the first solder layer 41 and the second solder layer 42 are set at H1+H2+$\alpha$. When H1=1 μm and H2=1 μm, for example, the respective thicknesses of the first solder layer 41 and the second solder layer 42 may be set at approximately 3 μm. In this case, $\alpha$=1 μm. These numerical values are merely examples, and the values may be set as appropriate, without any particular limitations, on the basis of the structure of the LED chip 1a and so on. The first solder layer 41 and the second solder layer 42 are preferably formed in central portions of regions of the mounting substrate 2a respectively opposing the first electrode 14 and the second electrode 15. The second solder layer 42 is disposed on the surface 22a of the second conductor portion 22 so as to be positioned on an inner side of a vertical projection region of the protruding structure 16 and at a remove from the vertical projection region. The vertical projection region of the protruding structure 16 is a region obtained by projecting the protruding structure 16 in a thickness direction thereof. In other words, the vertical projection region of the protruding structure 16 is a vertical projection region having a projection direction that extends in the thickness direction of the protruding structure 16. To put it another way, the vertical projection region of the protruding structure 16 is a vertical projection region projected onto a surface that is orthogonal to the thickness direction of the protruding structure 16.

When the first solder layer 41 and the second solder layer 42 are formed from AuSn, AuSn in which a composition ratio of the Au is smaller than that of a eutectic composition (70 at % Au, 30 at % Sn), for example AuSn having a composition that melts at no lower than 300° C. and lower than 400° C., for example (60 at % Au, 40 at % Sn, for example), is preferably employed. The first solder layer 41 and the second solder layer 42 are not limited to AuSn, and may be formed from any solder having a lower melting point than that of the mounting substrate 2a and the LED chip 1a.

In the first process, a first barrier layer 51 and a second barrier layer 52 are preferably formed between the first conductor portion 21 and the first solder layer 41 and between the second conductor portion 22 and the second solder layer 42, respectively. The first barrier layer 51 and the second barrier layer 52 function as diffusion barriers for suppressing variation in the AuSn composition caused by diffusion of the metal (Sn or the like, for example) between the first conductor portion 21 and the first solder layer 41 and between the second conductor portion 22 and the second solder layer 42. Pt, for example, may be employed as the material of the first barrier layer 51 and the second barrier layer 52, but the material is not limited thereto, and Pd or the like may be employed instead. In the first process, respective thicknesses of the first barrier layer 51 and the second barrier layer 52 are set at identical values. The respective thicknesses of the first barrier layer 51 and the second barrier layer 52 are preferably set at approximately 0.2 μm, for example. The first barrier layer 51 and the second barrier layer 52 can be formed by a vapor deposition method, a plating method, or the like, for example.

Further, in the first process, a first Au layer 61 and a second Au layer 62 are preferably formed on the first solder layer 41 and the second solder layer 42, respectively. The first Au layer 61 and the second Au layer 62 are not shown in FIG. 5. The first Au layer 61 and the second Au layer 62 are provided to suppress oxidation of the Sn in the first solder layer 41 and the second solder layer 42. The first Au layer 61 and the second Au layer 62 are preferably formed to be considerably thinner than the first solder layer 41 and the second solder layer 42, and respective thicknesses thereof are preferably set at no more than 0.1 μm, for example. The respective thicknesses of the first Au layer 61 and the second Au layer 62 must be set such that when the first solder layer 41 and the second solder layer 42 melt, the Au undergoes thermal diffusion to the first solder layer 41 and the second solder layer 42, thereby joining the first conductor portion 21 and the second conductor portion 22 to the first electrode 14 and the second electrode 15. The respective thicknesses of the first Au layer 61 and the second Au layer 62 are preferably set within a range of approximately 0.05 μm to 0.1 μm, for example. The first Au layer 61 and the second Au layer 62 can be formed by a vapor deposition method, a plating method, or the like, for example. Hereafter, a laminated film including the first barrier layer 51, the first solder layer 41, and the first Au layer 61 will be referred to as a first joint layer 71, and a laminated film including the second barrier layer 52, the second solder layer 42, and the second Au layer 62 will be referred to as a second joint layer 72. Note that as long as the first joint layer 71 includes at least the first solder layer 41, the first joint layer 71 is not limited to a laminated film, and may be a single layer film. Further, as long as the second joint layer 72 includes at least the second solder layer 42, the second joint layer 72 is not limited to a laminated film, and may be a single layer film.

In the second process, a first step and a second step are performed in sequence. Note that in the second process, a die bonding device, not shown in the drawings, is used. The die bonding device is preferably configured to include, for example, a suction holding tool capable of holding the LED chip 1a by suction, a stage for carrying the mounting substrate 2a, a first heater provided on the stage so as to be capable of heating the mounting substrate 2a, and a second heater mounted on either the suction holding tool or a holder that holds the suction holding tool. A collet or the like may be used as the suction holding tool.

Figure 6:
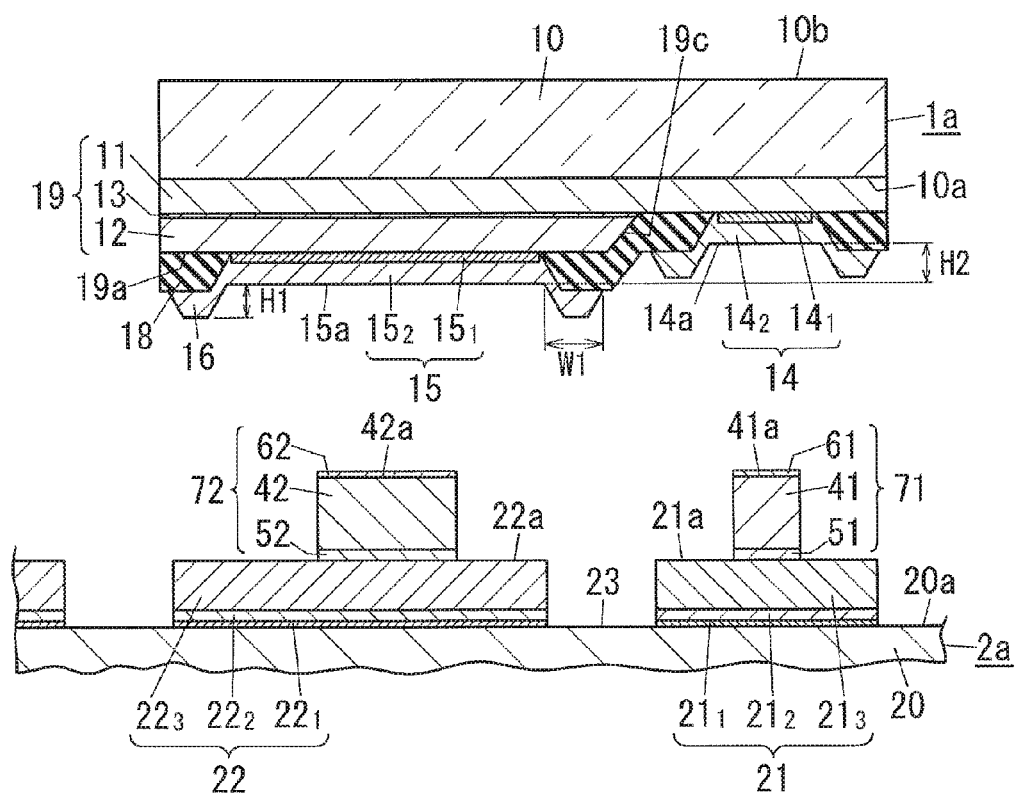
FIG. 6 is an illustrative view showing the method of manufacturing the light emitting device according to the first embodiment.

In the first step, as shown in FIG. 6, the LED chip 1a and the mounting substrate 2a are opposed. Opposing the LED chip 1a and the mounting substrate 2a means opposing the LED chip 1a and the mounting substrate 2a such that the first electrode 14 and the second electrode 15 of the LED chip 1a respectively oppose the first conductor portion 21 and the second conductor portion 22 of the mounting substrate 2a.

In the first step, the first electrode 14 and the second electrode 15 of the LED chip 1a are set to oppose the first conductor portion 21 and the second conductor portion 22 of the mounting substrate 2a while the LED chip 1a is held by suction by the suction holding tool.

In the second step, the first electrode 14 and the second electrode 15 of the LED chip 1a are joined respectively to the first conductor portion 21 and the second conductor portion 22 of the mounting substrate 2a by the first joint portion 31 formed from solder and the second joint portion 32 formed from solder. The first joint portion 31 is not limited to being formed from solder alone, and may include the first barrier layer 51 in addition to the part formed from solder. Further, the second joint portion 32 is not limited to being formed from solder alone, and may include the second barrier layer 52 in addition to the part formed from solder.

In the second step described above, the first solder layer 41 and the second solder layer 42 are melted while applying heat and pressure appropriately in a condition where the first electrode 14 and the second electrode 15 of the LED chip 1a are respectively superposed on the first joint layer 71 and the second joint layer 72 of the mounting substrate 2a so as to contact the first joint layer 71 and the second joint layer 72. When the first solder layer 41 melts, Au diffuses into the molten solder from the first Au layer 61, leading to an increase in the composition ratio of the Au in the molten solder. Further, when the second solder layer 42 melts, Au diffuses into the molten solder from the second Au layer 62, leading to an increase in the composition ratio of the Au in the molten solder.

In the second step, after melting the first solder layer 41 and the second solder layer 42 in the manner described above, the molten solder is pressed down so as to spread in a horizontal direction and fill the space 3 by applying pressure from the LED chip 1a side such that the protruding structure 16 contacts the second conductor portion 22. The molten solder is then cooled so as to coagulate.

In the second step, a process for heating the mounting substrate 2a using the first heater may be performed alone, or a process for heating the LED chip 1a using the second heater mounted on the collet or the holder that holds the collet may be performed in addition. In consideration of a joint strength between the mounting substrate 2a and the LED chip 1a, heating is preferably performed using both the first heater and the second heater in the second step. Furthermore, in the second step, pressure is applied by applying an appropriate load. The load is preferably set within a range of approximately 0.1 to 1 kg/cm$^2$ with respect to the single LED chip 1a, for example. Further, a load application time is preferably set within a range of approximately 0.1 to 1 second, for example. The second step is preferably performed in an N$_2$ gas atmosphere or a vacuum atmosphere.

A melting temperature of the first solder layer 41 and the second solder layer 42 is preferably lower than a heat resistant temperature of the LED chip 1a. To reduce the melting temperature of the first solder layer 41 and the second solder layer 42, the composition ratio of the Au is preferably set at a composition ratio in the vicinity of a eutectic composition. When the composition ratio of the Au is between 68 at % and 69 at %, for example, the melting temperature does not exceed 300° C. To ensure that the first solder layer 41 and the second solder layer 42 melt at or below 400° C. in a case where AuSn is used as the solder forming the first solder layer 41 and the solder forming the second solder layer 42, the composition ratio of the Au is preferably set to be no lower than 56 at % and lower than 70 at %, for example.

Incidentally, a volume of the second joint layer 72 formed in the first process is preferably set to be equal to a volume of the space 3 so that the solder forming the second joint portion 32 does not flow out of the space 3.

In this method of manufacturing the light emitting device B1, the LED chip 1a is joined to the mounting substrate 2a while the first solder layer 41 and the second solder layer 42 are respectively in a molten condition by pressing down the molten solder so that the protruding structure 16 of the LED chip 1a contacts the surface 22a of the second conductor portion 22. Hence, according to this method of manufacturing the light emitting device B1, a situation in which the first electrode 14 is not joined to the first conductor portion 21 can be avoided.

In this method of manufacturing the light emitting device B1, the protruding structure 16 contacts the second conductor portion 22, the first electrode 14 and the first conductor portion 21 are joined by the first joint portion 31 formed from solder, and the second electrode 15 and the second conductor portion 22 are joined by the second joint portion 32 formed from solder. Hence, with this method of manufacturing the light emitting device B1, the second joint portion 32 can be configured to fill the space 3 surrounded by the second electrode 15, the protruding structure 16, and the second conductor portion 22. In this method of manufacturing the light emitting device B1, when the molten solder of the second joint layer 72 is pressed down so as to spread in the horizontal direction, the protruding structure 16 prevents the molten solder from flowing over the surface of the LED chip 1a. Hence, with this method of manufacturing the light emitting device B1, the solder can be prevented from causing a short circuit between the first electrode 14 and the second electrode 15. Moreover, according to this method of manufacturing the light emitting device B1, it is possible to manufacture the light emitting device B1 such that the thermal resistance between the LED chip 1a and the mounting substrate 2a and variation therein can be reduced.

Figure 7:
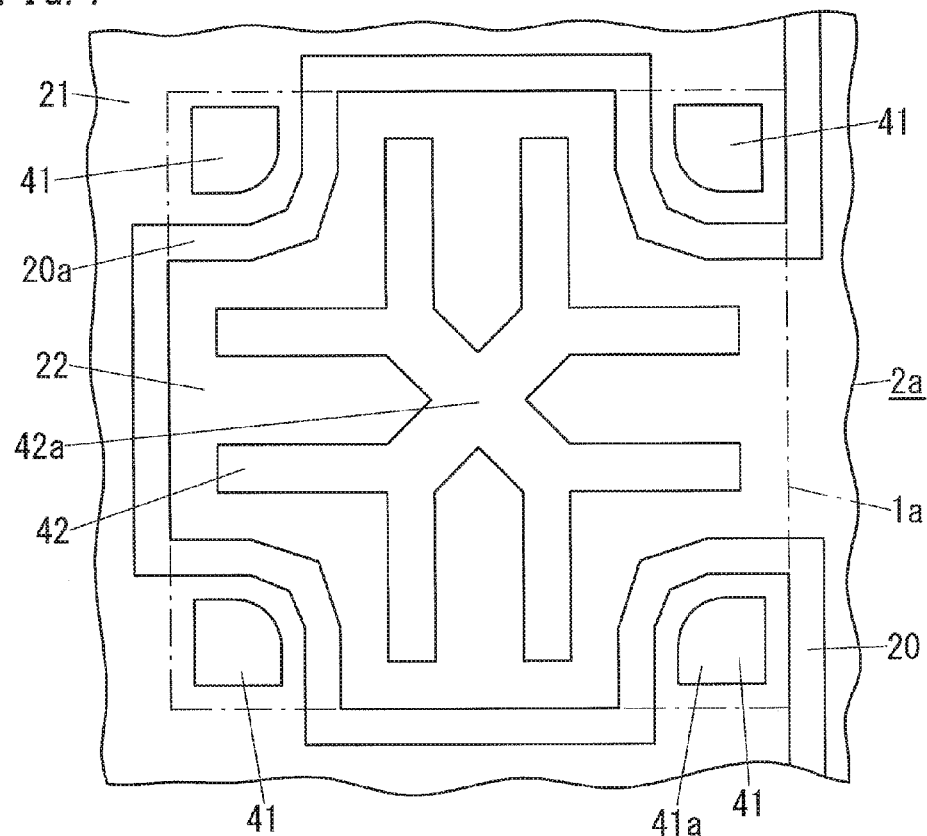
FIG. 7 is an illustrative view showing the method of manufacturing the light emitting device according to the first embodiment.

In this method of manufacturing the light emitting device B1, when the surface area of the second electrode 15 is larger than the surface area of the first electrode 14, unstable spreading is more likely to occur in the second joint portion 32 than in the first joint portion 31. Therefore, in this method of manufacturing the light emitting device B1, the second joint layer 72 is preferably formed in a predetermined pattern. The pattern of the second joint layer 72 may be modified as appropriate in accordance with the planar shape of the second electrode 15, but is preferably set in a radial shape such as that shown in FIGS. 5 and 7, for example, so that air bubbles are less likely to infiltrate. Hence, according to this method of manufacturing the light emitting device B1, the molten solder can be caused to spread out with stability when pressed down in the second step, and as a result, voids can be prevented from forming in the second joint portion 32.

Incidentally, in this method of manufacturing the light emitting device B1, a load is preferably applied to the protruding structure 16 such that the entire tip end surface thereof contacts the surface 22a of the second conductor portion 22. In this method of manufacturing the light emitting device B1, however, a flatness of the tip end surface of the protruding structure 16 differs from a flatness of the surface 22a of the second conductor portion 22, making it difficult to ensure that the entire tip end surface of the protruding structure 16 contacts the surface 22a of the second conductor portion 22. In this case, the tip end surface of the protruding structure 16 may be brought partially into contact with the surface 22a of the second conductor portion 22 such that a thin solder layer constituted by hardened solder that infiltrates during manufacture remains between the remaining part of the tip end surface of the protruding structure 16 and the surface 22a of the second conductor portion 22. In other words, as long as the flatness of the LED chip 1a relative to the mounting substrate 2a is within a desired range, the light emitting device B1 may be configured such that the protruding structure 16 contacts the surface 22a of the second conductor portion 22 partially. In this method of manufacturing the light emitting device B1, the difference between the flatness of the tip end surface of the protruding structure 16 and the flatness of the surface 22a of the second conductor portion 22 can be reduced by increasing the load exerted in the second step, and in so doing, an area of contact between the protruding structure 16 and the second conductor portion 22 can be increased. Further, in this method of manufacturing the light emitting device B1, when the protruding structure 16 is formed from metal or the like, for example, the protruding structure 16 can be deformed so as to be compressed by increasing the load exerted in the second step, and in so doing, the area of contact between the protruding structure 16 and the second conductor portion 22 can be increased.

In this method of manufacturing the light emitting device B1, as described above, the first Au layer 61 and the second Au layer 62 are preferably formed on the first solder layer 41 and the second solder layer 42, respectively, in the first process. Hence, with this method of manufacturing the light emitting device B1, the Sn of the first solder layer 41 and the second solder layer 42 can be prevented from oxidizing before the second process, enabling an improvement in the joint strength between the LED chip 1a and the mounting substrate 2a. The joint strength can be evaluated in accordance with the die shear strength, for example. The die shear strength is a force required to shear the LED chip 1a, which serves as a die joined to the mounting substrate 2a, parallel to the joint surface. The die shear strength can be measured using a die shear tester or the like, for example.

In the first process of this method of manufacturing the light emitting device B1, as described above, the first joint layer 71 and the second joint layer 72 are preferably formed on the side of the mounting substrate 2a. Hence, with this method of manufacturing the light emitting device B1, the light emitting device B1 can be manufactured more easily than in a case where the first joint layer 71 and the second joint layer 72 are formed on the side of the LED chip 1a.

The respective constituent elements of the light emitting device B1 will now be described in detail.

The mounting substrate 2a is a substrate on which the LED chip 1a is mounted. The term "mounted" is a concept that encompasses disposing the LED chip 1a and connecting the LED chip 1a mechanically and electrically. Accordingly, the mounting substrate 2a has a function for holding the LED chip 1a mechanically and a function for forming wiring used to supply power to the LED chip 1a. As the wiring, the mounting substrate 2a includes the first conductor portion 21 and the second conductor portion 22. The mounting substrate 2a is configured such that a single LED chip 1a can be mounted thereon. There are no particular limitations on the number of LED chips 1a that can be mounted on the mounting substrate 2a, and the mounting, substrate 2a may be configured such that a plurality of LED chips 1a can be mounted thereon, for example. The light emitting device B1 may be configured such that the plurality of LED chips 1a are connected in series, in parallel, or in series-parallel.

The mounting substrate 2a is configured such that the surface 21a of the first conductor portion 21 and the surface 22a of the second conductor portion 22 are coplanar.

The support 20 has a function for supporting the first conductor portion 21 and the second conductor portion 22 and a function for electrically insulating the first conductor portion 21 and the second conductor portion 22. The support 20 preferably also functions as a heat sink that conducts heat generated by the LED chip 1a efficiently to the outside. For this purpose, the support 20 is preferably formed from a highly thermally conductive material. For example, the support 20 may be configured using an aluminum nitride substrate. The support 20 is not limited to an aluminum nitride substrate, and may also be configured using a sapphire substrate, a silicon carbide substrate, or the like, for example. Alternatively, the support 20 may be configured by forming an electrical insulation layer on the surface of a silicon substrate, or by forming an electrical insulation layer constituted by an appropriate material on the surface of a metal plate. The material of the metal plate is preferably a metal exhibiting superior thermal conductivity. For example, copper, aluminum, silver, iron, aluminum alloy, phosphor bronze, bronze alloy, nickel alloy, Kovar, or the like may be employed as the material of the metal plate. $SiO_2$, $Si_3N_4$, or the like, for example, may be employed as the material of the electrical insulation layer formed on the surface of the silicon substrate.

In the mounting substrate 2a, the support 20 is formed in a flat plate shape, and the first conductor portion 21 and second conductor portion 22 are formed on a first surface 20a that is orthogonal to a thickness direction of the support 20. In the mounting substrate 2a, the thickness of the first conductor portion 21 and the thickness of the second conductor portion 22 are set at identical values. In the mounting substrate 2a, the shape of the support 20 is not limited to a flat plate shape, and instead, for example, a recessed portion for housing the LED chip 1a may be formed in one surface thereof. In this case, the first conductor portion 21 and the second conductor portion 22 may be formed on an inner bottom surface of the recessed portion.

The support 20 has a rectangular outer peripheral shape. The outer peripheral shape of the support 20 is not limited to a rectangular shape, and a polygonal shape other than a rectangular shape, a circular shape, or the like, for example, may be employed instead.

The first conductor portion 21 is a conductive layer to which the first electrode 14 of the LED chip 1a is electrically connected. The second conductor portion 22 is a conductive layer to which the second electrode 15 of the LED chip 1a is electrically connected.

The first conductor portion 21 and the second conductor portion 22 may be constituted by laminated films including respectively Ti films $21_1$, $22_1$, Pt films $21_2$, $22_2$, and Au films $21_3$, $22_3$, for example. The first conductor portion 21 and the second conductor portion 22 are not limited thereto, and instead, for example, laminated films including an Al film, an Ni film, a Pd film, and an Au film, laminated films including an Ni film and an Au film, laminated films including a Cu film, an Ni film, and an Au film, and so on may be employed. When the first conductor portion 21 and the second conductor portion 22 are formed from laminated films, an uppermost layer furthest removed from the support 20 is preferably formed from Au, and a lowermost layer closest to the support 20 is preferably formed from a material that can be adhered easily to the support 20. The first conductor portion 21 and the second conductor portion 22 are not limited to laminated films, and may be formed from single layer films.

In the mounting substrate 2a, the first conductor portion 21 and the second conductor portion 22 are formed so as to be spatially removed from each other. As a result, regarding the mounting substrate 2a, a groove 23 is formed between the first conductor portion 21 and the second conductor portion 22. An inner surface of the groove 23 is constituted by a part of the first surface 20a of the support 20 and opposing surfaces of the first conductor portion 21 and the second conductor portion 22. In the mounting substrate 2a, the first conductor portion 21 and the second conductor portion 22 are formed at identical thicknesses on the first surface 20a of the support 20. Hence, in the mounting substrate 2a, the surface 21a of the first conductor portion 21 and the surface 22a of the second conductor portion 22 are coplanar. A planar size of the mounting substrate 2a is preferably set to be larger than a chip size of the LED chip 1a.

There are no particular limitations on the chip size of the LED chip 1a. For example, a chip having a chip size of 0.4 mm square (0.4 mm×0.4 mm), 0.6 mm square (0.6 mm×0.6 mm), 0.8 mm square (0.8 mm×0.8 mm), 1 mm square (1 mm×1 mm), or the like may be used as the LED chip 1a. Further, the planar shape of the LED chip 1a is not limited to a square shape, and a rectangular shape or the like, for example, may be used instead. When the planar shape of the LED chip 1a is rectangular, a chip having a chip size of 0.5 mm×0.24 mm or the like, for example, may be used as the LED chip 1a.

In the LED chip 1a, the first electrode 14 and the second electrode 15 are provided on one thickness direction side of the LED chip 1a. As a result, the LED chip 1a can be mounted on the mounting substrate 2a by flip-chip mounting.

In the LED chip 1a, the first conductive semiconductor layer 11 and the second conductive semiconductor layer 12 are formed on the side of the first surface 10a of the substrate 10 in order from the side closest to the first surface 10a. In other words, the LED chip 1a includes a semiconductor multilayer film 19 including the first conductive semiconductor layer 11 and the second conductive semiconductor layer 12. In the LED chip 1a, the first conductive semiconductor layer 11 is constituted by an n-type semiconductor layer, and the second conductive semiconductor layer 12 is constituted by a p-type semiconductor layer. In the LED chip 1a, the first conductive semiconductor layer 11 may be constituted by a p-type semiconductor layer and the second conductive semiconductor layer 12 may be constituted by an n-type semiconductor layer.

The substrate 10 has a function for supporting the semiconductor multilayer film 19. The semiconductor multilayer film 19 may be formed using an epitaxial growth method. A crystal growth method such as a metal organic vapor phase epitaxy (MOVPE) method, a hydride vapor phase epitaxy (HVPE) method, or a molecular beam epitaxy (MBE) method, for example, may be employed as the epitaxial growth method. Note that the semiconductor multilayer film 19 may include impurities such as hydrogen, carbon, oxygen, silicon, and iron that inevitably become intermixed when the semiconductor multilayer film 19 is formed. The substrate 10 may be constituted by a crystal growth substrate used to form the semiconductor multilayer film 19.

The LED chip 1a is constituted by a blue LED chip that emits blue light. When the LED chip 1a is constituted by a GaN blue LED chip, a GaN substrate may be employed as the substrate 10, for example. The substrate 10 is not limited to a GaN substrate, and may be any substrate formed from a material that is capable of transmitting light emitted from the semiconductor multilayer film 19 efficiently. For example, a sapphire substrate or the like may be used. In short, the substrate 10 is preferably a substrate that is transparent to the light emitted from the semiconductor multilayer film 19. In the LED chip 1a, as described above, the first conductive semiconductor layer 11 and the second conductive semiconductor layer 12 are formed on the side of the first surface 10a of the substrate 10. In the LED chip 1a, therefore, a second surface 10b of the substrate 10 preferably forms a light extraction surface. Regarding the LED chip 1a, the semiconductor multilayer film 19 may include a buffer layer, not shown in the drawing, which is provided between the substrate 10 and the first conductive semiconductor layer 11. In the LED chip 1a, there are no particular limitations on the material of the semiconductor multilayer film 19 and the color of the light emitted thereby. In other words, the LED chip 1a is not limited to a blue LED chip, and maybe a purple LED chip, an ultraviolet LED chip, a red LED chip, a green LED chip, or the like, for example.

Regarding the LED chip 1a, the semiconductor multilayer film 19 preferably includes a light emitting layer 13 that is provided between the first conductive semiconductor layer 11 and the second conductive semiconductor layer 12. In this case, the light emitted from the semiconductor multilayer film 19 is light emitted from the light emitting layer 13, and an emission wavelength of the light is defined by the material of the light emitting layer 13. The light emitting layer 13 preferably has a single quantum well structure or a multiple quantum well structure, but is not limited thereto. For example, the first conductive semiconductor layer 11, the light emitting layer 13, and the second conductive semiconductor layer 12 may be formed such that the LED chip 1a has a double heterostructure.

The first conductive semiconductor layer 11 is not limited to a single layer structure, and may have a multilayer structure. The second conductive semiconductor layer 12 is likewise not limited to a single layer structure, and may have a multilayer structure. The second conductive semiconductor layer 12 may have a multilayer structure including a p-type electron block layer, a p-type semiconductor layer, and a p-type contact layer, for example. In this case, the p-type semiconductor layer is a layer for transporting electron holes to the light emitting layer 13. The p-type electron block layer is a layer for preventing electrons that do not recombine with the electron holes in the light emitting layer 13 from leaking (overflowing) to the p-type semiconductor layer side. A composition of the p-type electron block layer is preferably set such that the p-type electron block layer has higher bandgap energy than the p-type semiconductor layer and the light emitting layer. The p-type contact layer is a layer provided to reduce contact resistance with the second electrode 15 so that favorable ohmic contact is obtained with the second electrode 15. The p-type electron block layer and the p-type semiconductor layer may be constituted by AlGaN layers having different compositions, for example. Further, the p-type contact layer may be constituted by a p-type GaN layer, for example.

In the LED chip 1a, a part of the semiconductor multilayer film 19 is removed by etching from the side of a surface 19a of the semiconductor multilayer film 19 to a midway point in the first conductive semiconductor layer 11. In other words, the LED chip 1a has a mesa structure formed by etching a part of the semiconductor multilayer film 19. As a result, a step is formed in the LED chip 1*a* between the surface 12*a* of the second conductive semiconductor layer 12 and the surface 11*a* of the first conductive semiconductor layer 11. In the LED chip 1*a*, the first electrode 14 is formed on the exposed surface 11*a* of the first conductive semiconductor layer 11, and the second electrode 15 is formed on the surface 12*a* of the second conductive semiconductor layer 12. In the LED chip 1*a*, when the conductivity type (a first conductivity type) of the first conductive semiconductor layer 11 is the n type and the conductivity type (a second conductivity type) of the second conductive semiconductor layer 12 is the p type, the first electrode 14 and the second electrode 15 serve as a negative electrode and a positive electrode, respectively. Further, in the LED chip 1*a*, when the first conductivity type is the p type and the second conductivity type is the n type, the first electrode 14 and the second electrode 15 serve as a positive electrode and a negative electrode, respectively.

In the LED chip 1*a*, a surface area of the surface 12*a* of the second conductive semiconductor layer 12 is preferably larger than a surface area of the surface 11*a* of the first conductive semiconductor layer 11. Accordingly, in the LED chip 1*a*, a region in which the second conductive semiconductor layer 12 and the first conductive semiconductor layer 11 overlap in the respective thickness directions thereof can be increased in size, enabling an improvement in luminous efficiency.

In the LED chip 1*a*, the protruding structure 16 is formed to extend around the outer periphery of the second electrode 15, and to protrude on the side of the surface 12*a* of the second conductive semiconductor layer 12.

In the LED chip 1*a*, the second electrode 15 is preferably larger than the first electrode 14, and the protruding structure 16 is preferably formed to extend around the entire outer periphery of the second electrode 15. In so doing, the solder forming the second joint portion 32 can be prevented from causing a short circuit between the second electrode 15 and the first electrode 14 more effectively during manufacture of the light emitting device B1. Moreover, in the light emitting device B1, the shape of the second joint portion 32 can be reproduced more easily when mounting the LED chip 1*a* on the mounting substrate 2*a*, and therefore variation in the thermal resistance can be reduced. Furthermore, in the light emitting device B1, the thickness of the second joint portion 32 can be managed using the protruding structure 16, and therefore the precision of the thickness and size of the second joint portion 32 that joins the second electrode 15, which has a large radiation area, to the second conductor portion 22 can be increased without being affected by the thickness of the first joint portion 31. As a result, reductions in the thermal resistance and variation in the thermal resistance can be achieved.

The protruding structure 16 is preferably formed to extend around the outer periphery of the second electrode 15 at a constant width W1 (see FIG. 6). Hence, in the light emitting device B1, the contact area between the second electrode 15 and the second conductive semiconductor layer 12 can be increased while preventing the solder from causing a short circuit between the second electrode 15 and the first electrode 14. The width W1 of the protruding structure 16 is preferably set within a range of approximately 5 μm to 10 μm, for example.

In the LED chip 1*a*, the second electrode 15 is preferably formed to cover substantially the entire surface 12*a* of the second conductive semiconductor layer 12. Substantially the entire surface 12*a* of the second conductive semiconductor layer 12 is not limited to the entire surface 12*a*. For example, when the LED chip 1*a* includes an insulating film 18, to be described below, and an outer peripheral portion of the surface 12*a* of the second conductive semiconductor layer 12 is covered by the insulating film 18, substantially the entire surface 12*a* of the second conductive semiconductor layer 12 refers to the part of the surface 12*a* of the second conductive semiconductor layer 12 that is not covered by the insulating film 18. In other words, in the LED chip 1*a*, the second electrode 15 is preferably formed to cover the surface 12*a* of the second conductive semiconductor layer 12 in planar form. As a result, the radiation performance of the light emitting device B1 can be improved.

In the mounting substrate 2*a*, the respective thicknesses of the first conductor portion 21 and the second conductor portion 22 are preferably greater than an interval between the second electrode 15 and the second conductor portion 22. The interval between the second electrode 15 and the second conductor portion 22 denotes an interval between a central portion of the surface 15*a* (see FIG. 6) of the second electrode 15 and the surface 22*a* of the second conductor portion 22. The interval between the second electrode 15 and the second conductor portion 22 can be determined from the protrusion amount H1 of the protruding structure 16. In other words, the interval between the second electrode 15 and the second conductor portion 22 is substantially identical to the protrusion amount H1 of the protruding structure 16.

Hence, even when solder flows out of the space 3 during manufacture of the light emitting device B1, a flow speed of the outflowing solder can be reduced by the groove 23. Further, during manufacture of the light emitting device B1, a side face of the second conductor portion 22 can function as a solder guiding portion that guides the outflowing solder toward the side of the first surface 20*a* of the support 20. In the light emitting device B1, therefore, the solder flowing out of the space 3 can be prevented from causing a short circuit between the second electrode 15 and the first electrode 14. Note that the first surface 20*a* of the support 20 preferably has a lower solder wettability than the respective side faces of the first conductor portion 21 and the second conductor portion 22.

The LED chip 1*a* preferably includes the insulating film 18, which is formed on the surface 12*a* of the second conductive semiconductor layer 12 so as to surround a contact region of the second electrode 15 in which the second electrode 15 contacts the second conductive semiconductor layer 12. Further, in the LED chip 1*a*, the second electrode 15 is formed to extend over the surface 12*a* of the second conductive semiconductor layer 12 and a surface of the insulating film 18, and an outer peripheral portion of the second electrode 15, which protrudes beyond the central portion in a direction heading away from the second conductive semiconductor layer 12, doubles as the protruding structure 16. Hence, in the light emitting device B1, a joint area between the second electrode 15 and the second conductor portion 22 can be increased, leading to an improvement in the radiation performance and a reduction in contact resistance.

$SiO_2$ is employed as the material of the insulating film 18. The insulating film 18 is therefore a silicon oxide film. The insulating film 18 may be any electrical insulating film. Accordingly, the material of the insulating film 18 is not limited to $SiO_2$, and may be any material exhibiting an electrical insulating property. For example, $Si_3N_4$, $Al_2O_3$, $TiO_2$, $Ta_2O_5$, $ZrO_2$, $Y_2O_3$, $CeO_2$, $Nb_2O_5$, and so on may be used. A thickness of the insulating film 18 is set at 1 μm, for example, but there are no particular limitations thereon. The insulating film 18 may be formed using a CVD (chemical vapor deposition) method, a vapor deposition method, a sputtering method, or the like, for example. The insulating film 18 is not limited to a single layer film, and may be constituted by a multilayer film. The multilayer film provided as the insulating film 18 may be formed from a dielectric multilayer film that reflects the light generated by the semiconductor multilayer film 19.

In the LED chip 1a, the insulating film 18 is preferably formed to extend over the mesa structure surface 19a (the surface 12a of the second conductive semiconductor layer 12), a side face 19c, and the surface 11a of the first conductive semiconductor layer 11. The part of the insulating film 18 formed on the surface 11a of the first conductive semiconductor layer 11 is preferably formed in a pattern that surrounds a contact region of the first electrode 14 in which the first electrode 14 contacts the first conductive semiconductor layer 11.

The insulating film 18 preferably functions as a passivation film that protects the functions of the semiconductor multilayer film 19, and either $SiO_2$ or $Si_3N_4$ is preferably used as the material thereof. In so doing, an improvement in reliability can be achieved in the light emitting device B1.

In the LED chip 1a, contact between the first and second electrodes 14, 15 and the first and second conductive semiconductor layers 11, 12 is preferably ohmic contact. Ohmic contact is contact in which a current generated in accordance with a direction of a voltage applied while the first and second electrodes 14, 15 and the first and second conductive semiconductor layer 11, 12 are in contact with each other is non-rectifying. In ohmic contact, a current-voltage characteristic is preferably substantially linear, and more preferably linear. Further, in ohmic contact, the contact resistance is preferably small. In the contact between the first electrode 14 and the first conductive semiconductor layer 11, a current passing through an interface between the first electrode 14 and the first conductive semiconductor layer 11 is considered to be a sum of a thermionic emission current that passes over a Schottky barrier and a tunnel current that passes through the Schottky barrier. In the contact between the second electrode 15 and the second conductive semiconductor layer 12, a current passing through an interface between the second electrode 15 and the second conductive semiconductor layer 12 is considered to be the sum of the thermionic emission current that passes over the Schottky barrier and the tunnel current that passes through the Schottky barrier. Hence, when the tunnel current is dominant in the contact between the first and second electrodes 14, 15 and the first and second conductive semiconductor layers 11, 12, ohmic contact is considered to be approximated.

The first electrode 14 includes an electrode layer (a first connection electrode layer) $14_1$ and an electrode layer (a first pad electrode layer) $14_2$. The electrode layer $14_1$ is formed on the surface 11a of the first conductive semiconductor layer 11 in order to obtain ohmic contact with the first conductive semiconductor layer 11. The electrode layer $14_2$ is formed to cover the electrode layer $14_1$ so as to be joined to the mounting substrate 2a via the first joint portion 31. The electrode layer $14_1$ can be formed by depositing an Al film on the surface 11a of the first conductive semiconductor layer 11 using a vapor deposition method or the like, for example. The electrode layer $14_2$ may be formed from a laminated film including a Ti film and an Au film, for example. The electrode layer $14_2$ can be formed using a vapor deposition method or the like, for example. The first electrode 14 is not limited to this layer structure, and instead, for example, the first electrode 14 may be formed entirely from the electrode layer $14_1$ alone. Alternatively, the first electrode 14 may be configured such that another electrode layer is provided between the electrode layer $14_1$ and the electrode layer $14_2$.

The second electrode 15 includes an electrode layer (a second connection electrode layer) $15_1$ and an electrode layer (a second pad electrode layer) $15_2$. The electrode layer $15_1$ is formed on the surface 12a of the second conductive semiconductor layer 12 in order to obtain ohmic contact with the second conductive semiconductor layer 12. The electrode layer $15_1$ is formed to cover the electrode layer $15_1$ so as to be joined to the mounting substrate 2a via the second joint portion 32. The electrode layer $15_1$ may be formed by depositing a laminated film including an Ni film and an Ag film on the surface 12a of the second conductive semiconductor layer 12 using a vapor deposition method or the like, for example. The electrode layer $15_2$ may be formed from a laminated film including a Ti film and an Au film, for example. The electrode layer $15_2$ can be formed using a vapor deposition method or the like, for example. The second electrode 15 is not limited to this layer structure, and instead, for example, the second electrode 15 may be formed entirely from the electrode layer $15_1$ alone. Alternatively, the second electrode 15 may be configured such that another electrode layer is provided between the electrode layer $15_1$ and the electrode layer $15_2$.

The electrode layer $15_2$ is preferably formed to extend over the surface of the electrode layer $15_1$ and the surface of the insulating film 18. In the light emitting device B1, the outer peripheral portion of the second electrode 15, which protrudes further than the central portion in the direction heading away from the second conductive semiconductor layer 12, preferably doubles as the protruding structure 16. Hence, in the light emitting device B1, the contact area between the LED chip 1a and the mounting substrate 2a can be increased, leading to a reduction in thermal resistance, and moreover, the heat generated by the semiconductor multilayer film 19 of the LED chip 1a can be transmitted easily to the side of the mounting substrate 2a through the protruding structure 16. As a result, the radiation performance of the light emitting device B1 can be improved.

Incidentally, in the method of manufacturing the light emitting device B1 described above, the second joint layer 72 (see FIGS. 4 and 6) uses a larger amount of solder than the first joint layer 71 (see FIGS. 4 and 6), and the thickness thereof varies more greatly during the second process. With this method of manufacturing the light emitting device B1, therefore, a larger amount of molten solder is pressed down on the second joint layer 72 than on the first joint layer 71, and as a result, solder is more likely to flow out of the space 3 due to the variation in the thickness of the second joint layer 72 and so on.

In the light emitting device B1, an interval L2 between the first conductor portion 21 and the second conductor portion 22 is preferably wider than an interval L1 between the first electrode 14 and the second electrode 15. Hence, in the light emitting device B1, the solder that flows out of the space 3 can be absorbed by the groove 23 while preventing a short circuit between the first electrode 14 and the second electrode 15 and without modifying the respective shapes of the first electrode 14 and the second electrode 15 in the LED chip 1a. In the light emitting device B1, a first conductor portion 21 side end of the second conductor portion 22 is preferably set further back than a first electrode 14 side end of the second electrode 15 to make the interval L2 between the first conductor portion 21 and the second conductor portion 22 wider than the interval L1 between the first electrode 14 and the second electrode 15. Hence, in the light emitting device B1, which is configured such that the second electrode 15 of the LED chip 1a is larger than the first electrode 14, for example, the solder that flows out of the space 3 can be absorbed by the groove 23 while preventing a short circuit between the first electrode 14 and the second electrode 15 and without modifying the respective shapes of the first electrode 14 and the second electrode 15 in the LED chip 1a. Here, as described above, the light emitting device B1 is preferably configured such that the respective thicknesses of the first conductor portion 21 and the second conductor portion 22 are greater than the interval between the second electrode 15 and the second conductor portion 22. Hence, in the light emitting device B1, the solder that flows out of the space 3 can be prevented from causing a short circuit between the second electrode 15 and the first electrode 14 even more effectively.

The second joint portion 32 preferably includes a second barrier layer 52 as a barrier layer formed on the surface 22a of the second conductor portion 22 in addition to the part thereof formed from solder. The second barrier layer 52 functions as a diffusion barrier. In the second joint portion 32, the second barrier layer 52 is preferably formed on an inner side the protruding structure 16 and at a remove from the protruding structure 16. Further, the part of the second joint portion 32 formed from solder is preferably formed to cover the part of the surface 22a of the second conductor portion 22 in which the second barrier layer 52 is not formed, as well as a front surface and side faces of the second barrier layer 52. Hence, in the light emitting device B1, solder corrosion caused by a thermal history during the mounting process can be suppressed, whereby a mechanical characteristic, an electrical characteristic, a chemical characteristic, and so on of the second joint portion 32 can be stabilized. As a result, a joint reliability of the second joint portion 32 can be improved.

Figure 8:
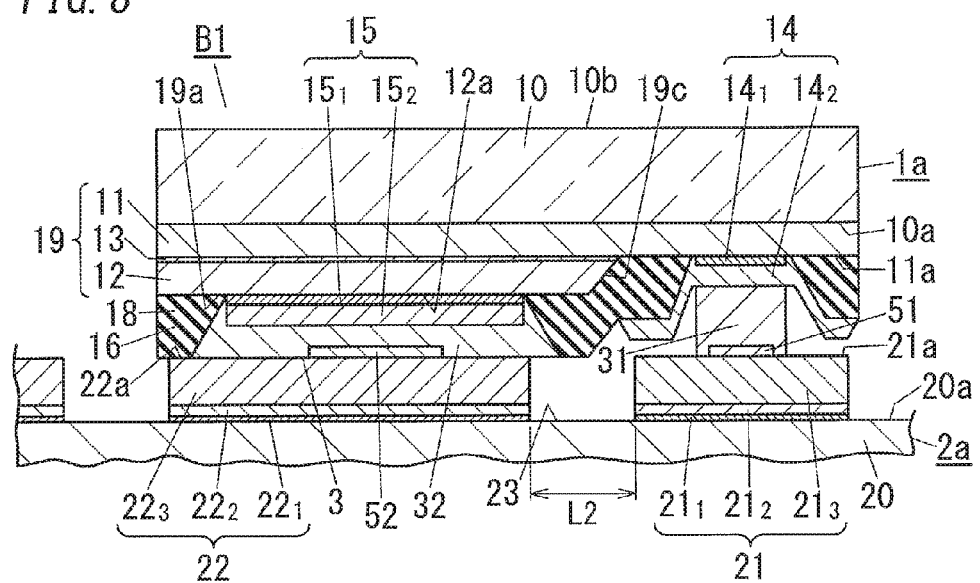
FIG. 8 is a schematic sectional view showing main parts of a first modified example of the light emitting device according to the first embodiment.

In the LED chip 1a, as described above, the insulating film 18 is preferably formed on the surface 12a of the second conductive semiconductor layer 12 so as to surround the contact region of the second electrode 15 in which the second electrode 15 contacts the second conductive semiconductor layer 12. In a first modified example of the light emitting device B1, as shown in FIG. 8, the insulating film 18 may double as the protruding structure 16. In this case, the electrode layer $15_2$ of the second electrode 15 may be provided only on the surface of the electrode layer $15_1$, and a film thickness of the insulating film 18 may be set to be larger than the thickness of the second electrode 15. Hence, according to the first modified example of the light emitting device B1, an improved electrical insulating property can be obtained between the second electrode 15 and the first electrode 14. Moreover, the structure and manufacturing process of the LED chip 1a can be simplified, enabling a reduction in cost. Furthermore, according to the first modified example of the light emitting device B1, the protrusion amount of the protruding structure 16 can be set to equal a difference between the film thickness of the insulating film 18 and the thickness of the second electrode 15, and therefore the precision of the protrusion amount of the protruding structure 16 can be improved.

Figure 9:
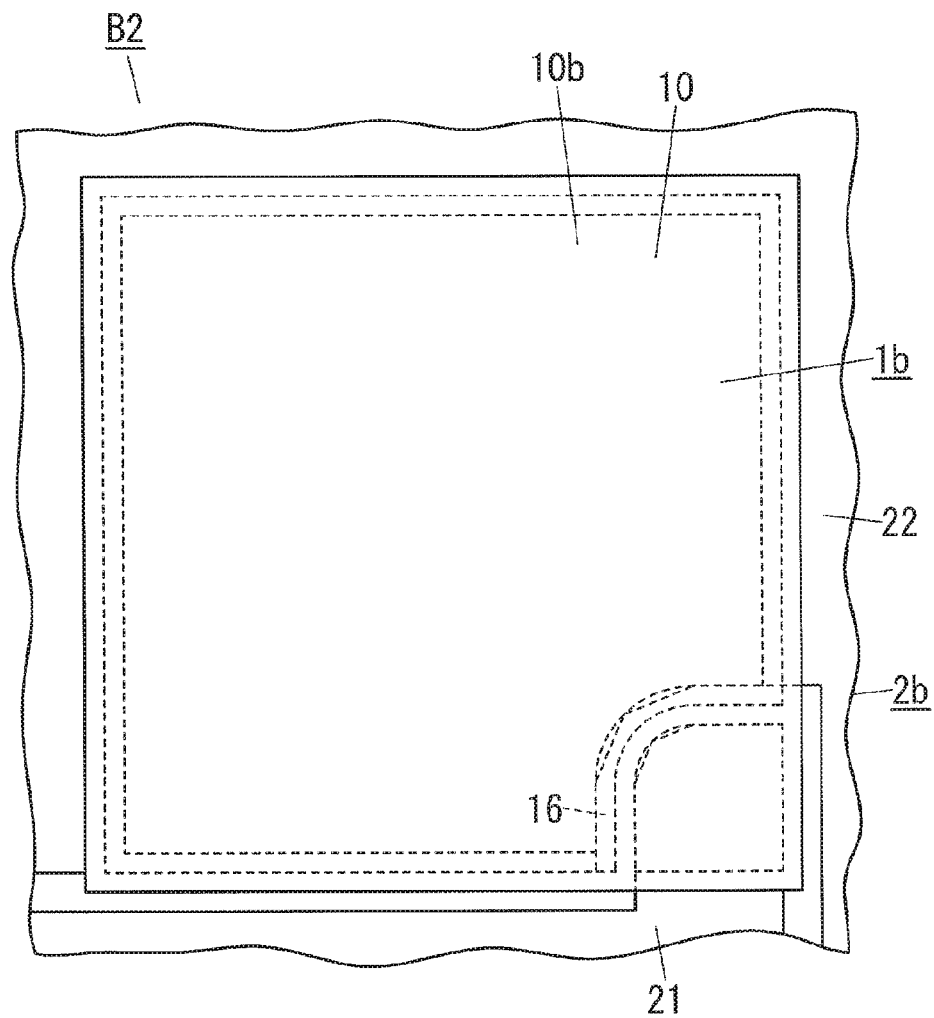
FIG. 9 is a schematic plan view showing main parts of a second modified example of the light emitting device according to the first embodiment.

FIG. 9 is a schematic plan view showing a light emitting device B2 serving as a second modified example of the light emitting device B1 according to this embodiment. The light emitting device B2 has a substantially identical basic configuration to the light emitting device B1. The light emitting device B2 differs from the light emitting device B1 only in the respective shapes of the first electrode 14 and the second electrode 15 provided on an LED chip 1b (see FIG. 10), the respective shapes of the first conductor portion 21 and the second conductor portion 22 provided on a mounting substrate 2b (see FIG. 11), and so on. Accordingly, a detailed description of the light emitting device B2 has been omitted. Note that constituent elements of the light emitting device B2 that are identical to their counterparts in the light emitting device B1 have been allocated identical reference symbols.

The LED chip 1b has a smaller chip size than the LED chip 1a (see FIGS. 1 and 3). In the LED chip 1a, the surface 11a of the first conductive semiconductor layer 11 is exposed from each of the four corners of the semiconductor multilayer film 19, and the first electrode 14 is formed on each surface 11a. Hence, the LED chip 1a includes four first electrodes 14. In the LED chip 1b, on the other hand, the surface 11a of the first conductive semiconductor layer 11 is exposed from one of the four corners of the semiconductor multilayer film 19, and the first electrode 14 is formed on the exposed surface 11a. Hence, the LED chip 1b differs from the LED chip 1a in the shape of the second electrode 15.

Figure 12:
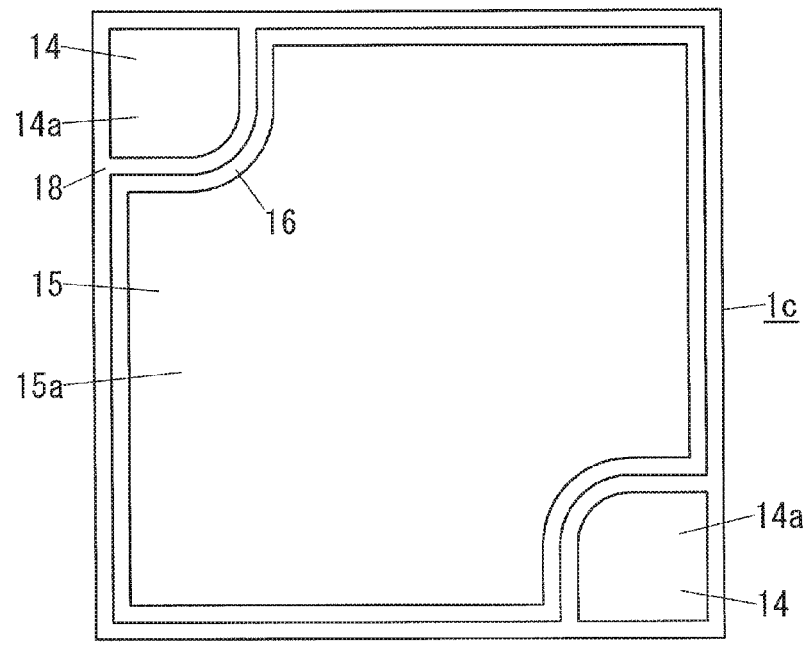
FIG. 12 is a schematic plan view showing an LED chip employed in a third modified example of the light emitting device according to the first embodiment.

FIG. 12 is a schematic bottom view of an LED chip 1c provided in a third modified example of the light emitting device B1 according to this embodiment. In the third modified example of the light emitting device B1, the respective shapes of the first electrode 14 and the second electrode 15 provided on the LED chip 1c differ from the LED chip 1a. Further, the third modified example of the light emitting device B1 differs in that a mounting substrate (not shown) obtained by modifying the respective shapes of the first and second conductor portions 21, 22 and so on of the mounting substrate 2a is provided in place of the mounting substrate 2a of the light emitting device B1. Accordingly, a detailed description of the third modified example of the light emitting device B1 has been omitted.

Figure 10:
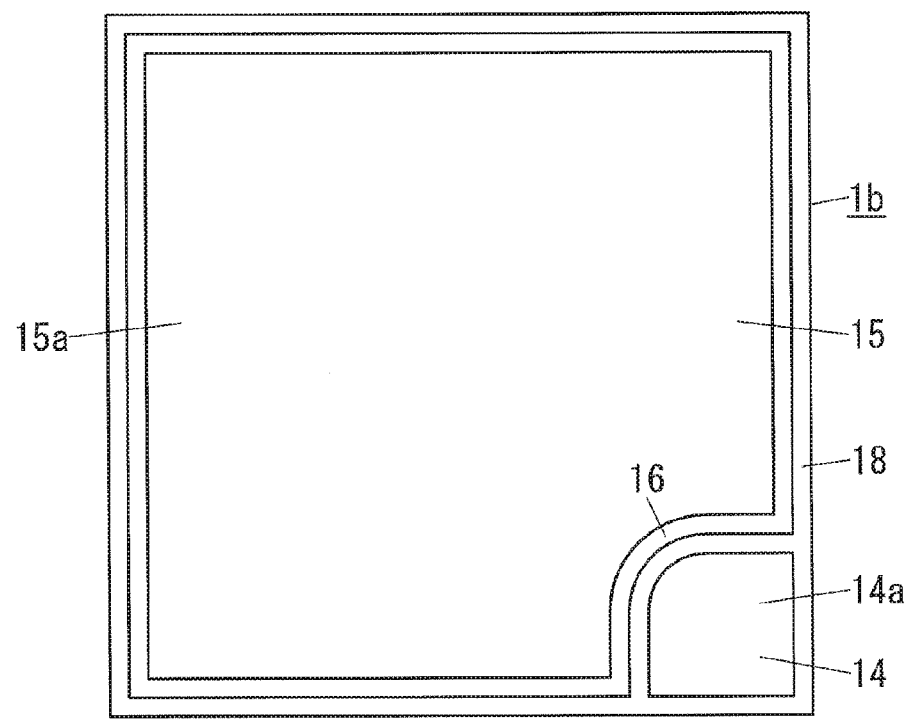
FIG. 10 is a schematic plan view showing an LED chip employed in the second modified example of the light emitting device according to the first embodiment.
Figure 11:
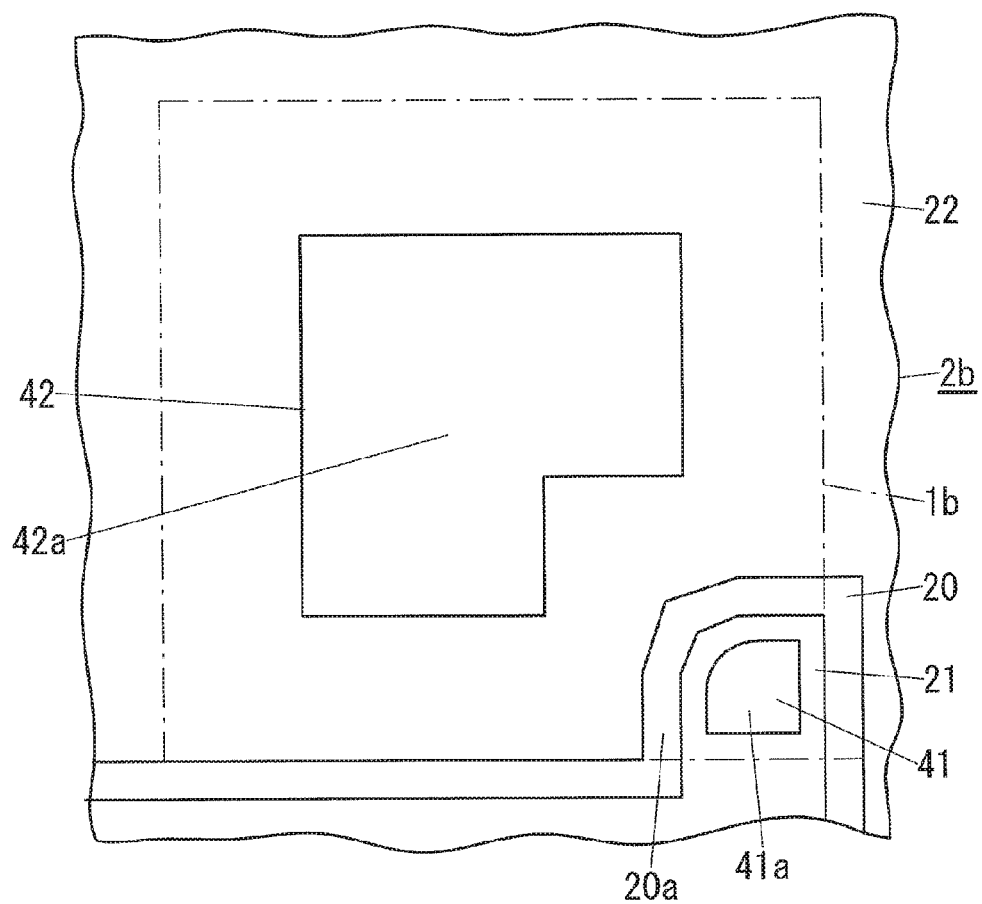
FIG. 11 is an illustrative view showing a method of manufacturing the second modified example of the light emitting device according to the first embodiment.

The LED chip 1c has a smaller chip size than the LED chip 1a (see FIGS. 1 and 3) and a larger chip size than the LED chip 1b (see FIGS. 9 and 10). In the LED chip 1c, the surface 11a of the first conductive semiconductor layer 11 is exposed from two of the four corners of the semiconductor multilayer film 19, and the first electrode 14 is formed on each of the exposed surfaces 11a. Hence, the LED chip 1c includes two first electrodes 14, and differs from the LED chips 1a, 1b in the shape of the second electrode 15.

Second Embodiment

Figure 13:
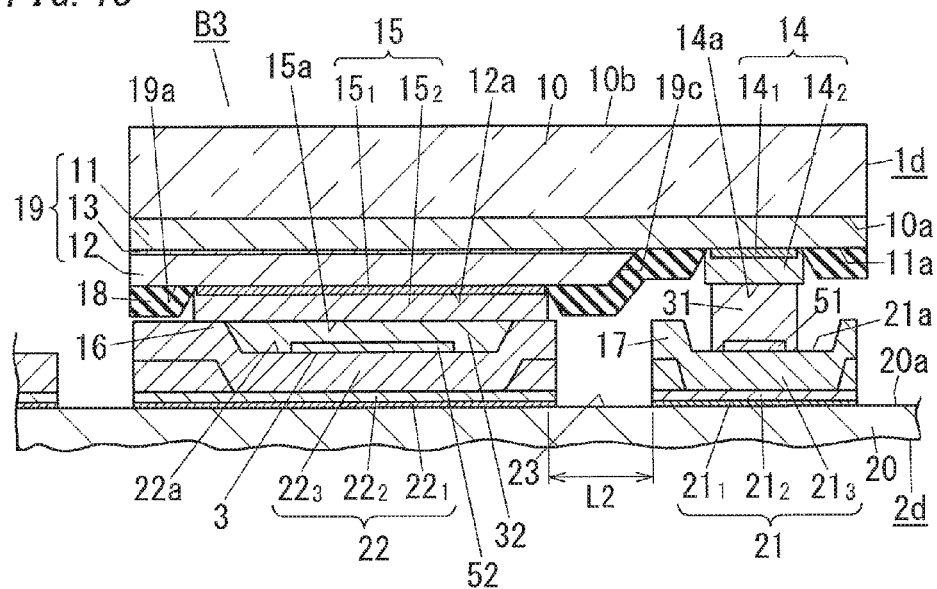
FIG. 13 is a schematic sectional view showing main parts of a light emitting device according to a second embodiment.
Figure 14:
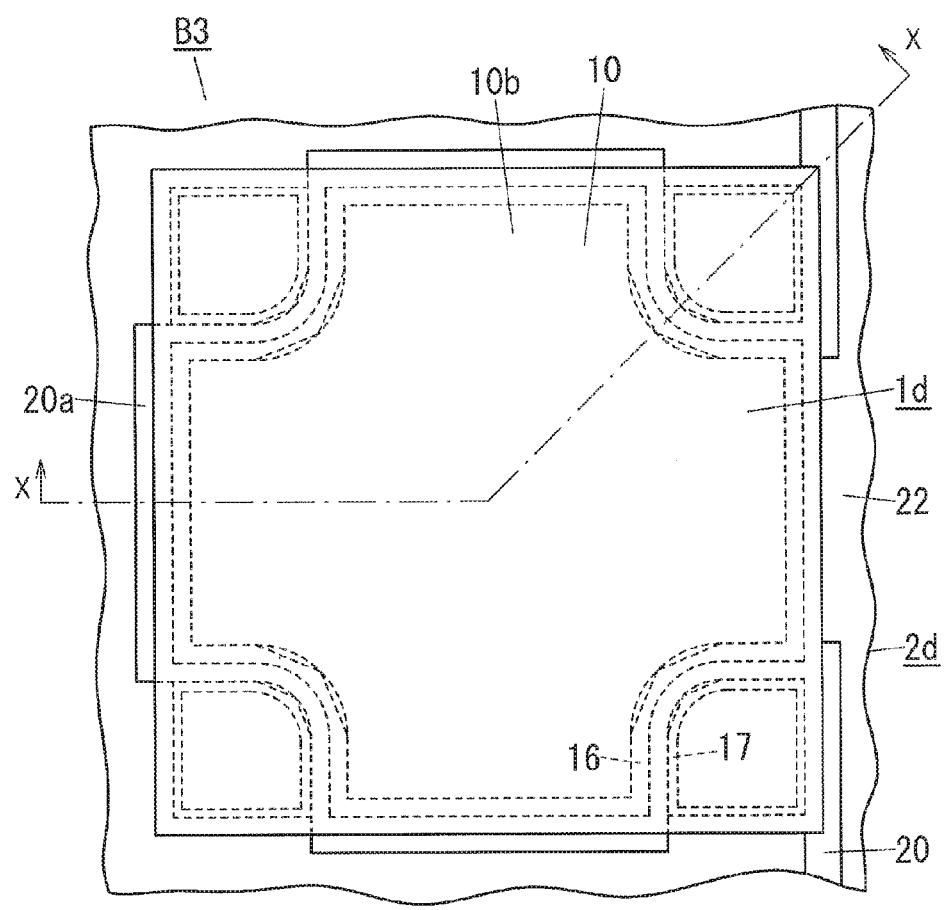
FIG. 14 is a schematic plan view showing the main parts of the light emitting device according to the second embodiment.

A light emitting device B3 according to this embodiment will be described below on the basis of FIGS. 13 to 18. FIG. 13 is a pattern-form schematic sectional view corresponding to an X-X cross-section of FIG. 14. Note that constituent elements of the light emitting device B3 according to this embodiment that are identical to their counterparts in the light emitting device B1 according to the first embodiment have been allocated identical reference symbols, and where appropriate, description thereof has been omitted.

The light emitting device B3 includes a mounting substrate 2d and an LED chip 1d mounted on the mounting substrate 2d. The mounting substrate 2d includes the support 20, and the first conductor portion 21 and second conductor portion 22 that are supported by the support 20 such that the LED chip 1d is electrically connected thereto. The LED chip 1d includes the substrate 10, the first conductive semiconductor layer 11 formed on the side of the first surface 10a of the substrate 10, and the second conductive semiconductor layer 12 formed on the opposite side of the first conductive semiconductor layer 11 to the substrate 10. The LED chip 1d also includes the first electrode 14 formed on the surface 11*a* of the first conductive semiconductor layer 11 that is exposed to the opposite side to the substrate 10, and the second electrode 15 formed on the surface 12*a* of the second conductive semiconductor layer 12. Further, the light emitting device B3 includes the protruding structure 16 that protrudes from one of the side of the surface 12*a* of the second conductive semiconductor layer 12 and the side of the surface 22*a* of the second conductor portion 22 toward the other side so as to contact the other side, and is positioned so as to extend around the outer periphery of the second electrode 15. Furthermore, in the light emitting device B3, the first electrode 14 and the first conductor portion 21 are joined to each other by the first joint portion 31 formed from solder, while the second electrode 15 and the second conductor portion 22 are joined to each other by the second joint portion 32 formed from solder. The second joint portion 32 is formed so as to fill the space 3 surrounded by the second electrode 15, the protruding structure 16, and the second conductor portion 22. The protruding structure 16 is disposed to extend around the outer periphery of the second electrode 15 so as to surround the second joint portion 32 in planar view. Only the first joint portion 31 is interposed between the LED chip 1*d* and the first conductor portion 21. Hence, in the light emitting device B3, the first joint portion 31 and the second joint portion 32 can be respectively reduced in thickness, and moreover, the first joint portion 31 and the second joint portion 32 can respectively be joined to the first conductor portion 21 and the second conductor portion 22 by surface joints. As a result, thermal resistance between the LED chip 1*d* and the mounting substrate 2*d* of the light emitting device B3 can be reduced. Furthermore, in the light emitting device B3, the thickness of the second joint portion 32 can be managed using the protruding structure 16, and therefore the thickness and size of the second joint portion 32 can be set more precisely, enabling reductions in the thermal resistance and variation in the thermal resistance. In short, with the light emitting device B3, variation in the thermal resistance among finished products can be reduced. As a result, improvements in the radiation performance and reliability of the light emitting device B3 can be achieved. The expression "the protruding structure 16 in planar view" means that the protruding structure 16 is seen from the thickness direction of the protruding structure 16, which corresponds to the thickness direction of the LED chip 1*d*.

Preferably, the protruding structure 16 is formed on the second conductor portion 22 so as to extend around the outer periphery of the second electrode 15, and protrudes further on the side of the surface 22*a* of the second conductor portion 22 than the periphery thereof on the mounting substrate 2*d*. As a result, the light emitting device B3 can be configured such that the protruding structure 16 contacts the surface 15*a* of the second electrode 15, and such that the second joint portion 32 is formed so as to fill the space 3 surrounded by the second electrode 15, the protruding structure 16, and the second conductor portion 22.

In this specification, for convenience, the respective constituent elements of the light emitting device B3 will be described in detail after describing a method of manufacturing the light emitting device B3.

In the method of manufacturing the light emitting device B3 according to this embodiment, first, the LED chip 1*d* and the mounting substrate 2*d* are prepared, whereupon first and second processes are performed in sequence.

Figure 15:
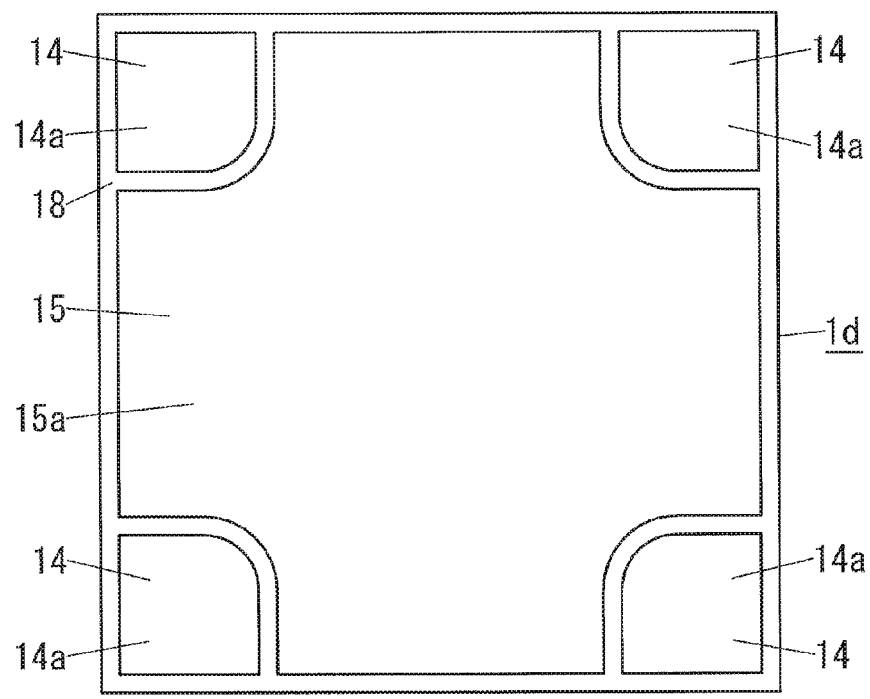
FIG. 15 is a schematic plan view showing an LED chip of the light emitting device according to the second embodiment.
Figure 16:
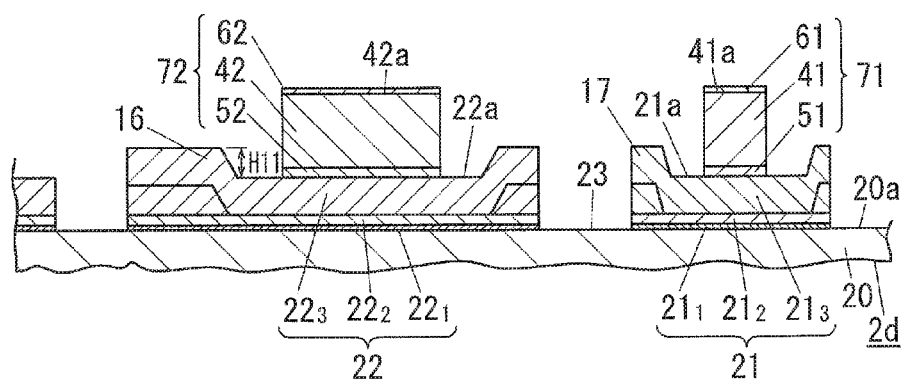
FIG. 16 is an illustrative view showing a method of manufacturing the light emitting device according to the second embodiment.
Figure 17:
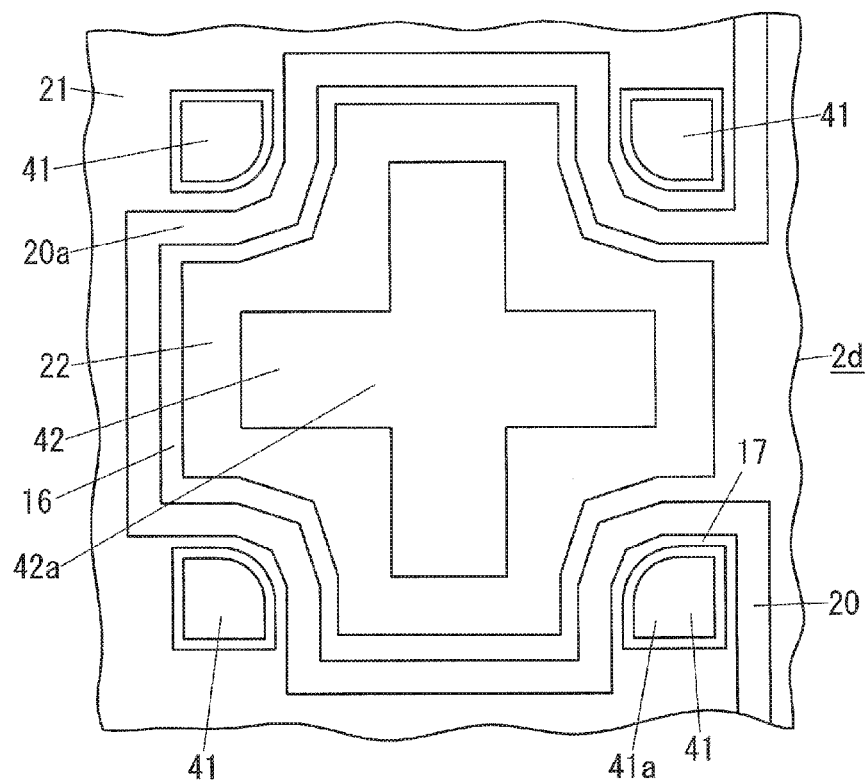
FIG. 17 is an illustrative view showing the method of manufacturing the light emitting device according to the second embodiment.

In the first process, as shown in FIGS. 16 and 17, the first solder layer 41 and the second solder layer 42 serving respectively as the bases of the first joint portion 31 and the second joint portion 32 are formed on the side of the surface 21*a* of the first conductor portion 21 and the side of the surface 22*a* of the second conductor portion 22, of the mounting substrate 2*d*, respectively. AuSn, for example, may be employed as the solder serving as the material of the first solder layer 41 and the second solder layer 42. The first solder layer 41 and the second solder layer 42 can be formed by a vapor deposition method, a plating method, or the like, for example. In the first process, the respective thicknesses of the first solder layer 41 and the second solder layer 42 are set at identical values. The surface area of the surface 41*a* of the first solder layer 41 is set to be smaller than the surface area of the surface 14*a* (see FIG. 15) of the first electrode 14. Further, the surface area of the surface 42*a* of the second solder layer 42 is set to be smaller than the surface area of the surface 15*a* (see FIG. 15) of the second electrode 15. The respective thicknesses of the first solder layer 41 and the second solder layer 42 are set to exceed, by the predetermined thickness (a), a sum (H11+H2) of a protrusion amount H11 (see FIG. 18) by which the protruding structure 16 protrudes from the surface 22*a* of the second conductor portion 22 and the step H2 (see FIG. 18) between the second electrode 15 and the first electrode 14 in a thickness direction of the LED chip 1*d*. In other words, the respective thicknesses of the first solder layer 41 and the second solder layer 42 are set at H11+H2+α. When H11=1 μm and H2=1 μm, for example, the respective thicknesses of the first solder layer 41 and the second solder layer 42 may be set at approximately 3 μm. In this case, α=1 μm. These numerical values are merely examples, and the values may be set as appropriate, without any particular limitations, on the basis of the structure of the LED chip 1*d* and so on. The first solder layer 41 and the second solder layer 42 are preferably formed in central portions of regions of the mounting substrate 2*d* respectively opposing the first electrode 14 and the second electrode 15. The second solder layer 42 is disposed on the surface 22*a* of the second conductor portion 22 so as to be positioned on the inner side of the protruding structure 16 and at a remove from the protruding structure 16 in planar view.

In the first process, the first barrier layer 51 and the second barrier layer 52 are preferably formed between the first conductor portion 21 and the first solder layer 41 and between the second conductor portion 22 and the second solder layer 42, respectively.

Further, in the first process, the first Au layer 61 and the second Au layer 62 are preferably formed on the first solder layer 41 and the second solder layer 42, respectively. The first Au layer 61 and the second Au layer 62 are not shown in FIG. 17. Hereafter, the laminated film including the first barrier layer 51, the first solder layer 41, and the first Au layer 61 will be referred to as the first joint layer 71, and the laminated film including the second barrier layer 52, the second solder layer 42, and the second Au layer 62 will be referred to as the second joint layer 72. Note that as long as the first joint layer 71 includes at least the first solder layer 41, the first joint layer 71 is not limited to a laminated film, and may be a single layer film. Further, as long as the second joint layer 72 includes at least the second solder layer 42, the second joint layer 72 is not limited to a laminated film, and may be a single layer film.

In the second process, a first step and a second step are performed in sequence. Note that in the second process, a die bonding device, not shown in the drawings, is used. The die bonding device is preferably configured to include, for example, a suction holding tool capable of holding the LED chip 1d by suction, a stage for carrying the mounting substrate 2d, a first heater provided on the stage so as to be capable of heating the mounting substrate 2d, and a second heater mounted on either the suction holding tool or a holder that holds the suction holding tool. A collet or the like may be used as the suction holding tool.

Figure 18:
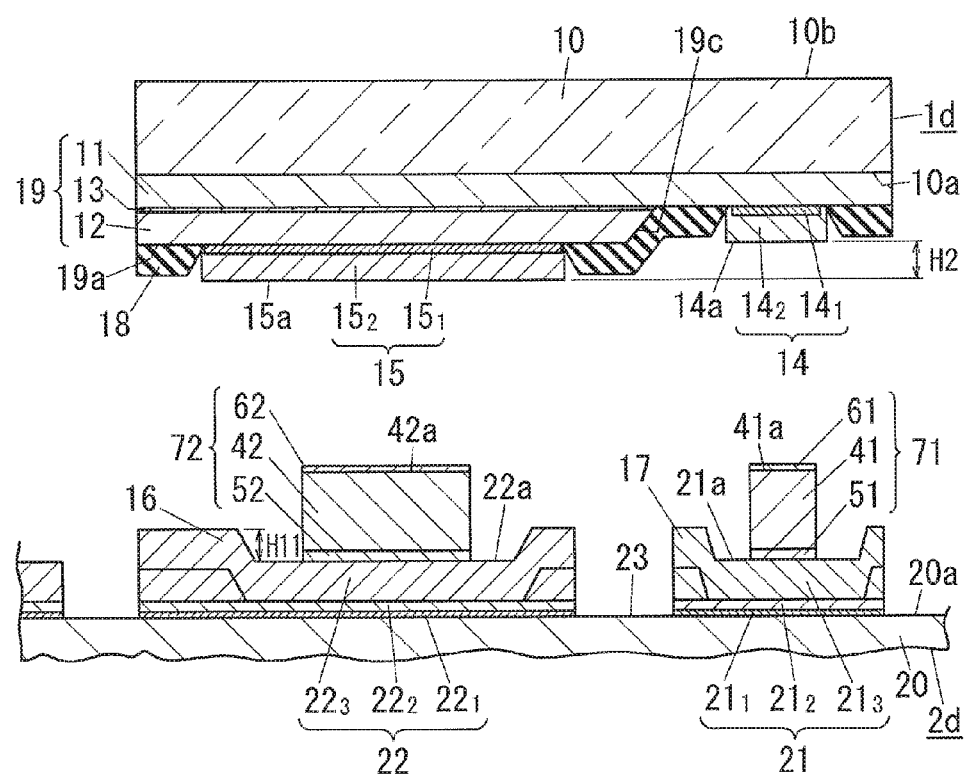
FIG. 18 is an illustrative view showing the method of manufacturing the light emitting device according to the second embodiment.

In the first step, as shown in FIG. 18, the LED chip 1d and the mounting substrate 2d are opposed.

In the first step, the first electrode 14 and the second electrode 15 of the LED chip 1d are set to oppose the first conductor portion 21 and the second conductor portion 22 of the mounting substrate 2d while the LED chip 1d is held by suction by the suction holding tool.

In the second step, the first electrode 14 and the second electrode 15 of the LED chip 1d are joined respectively to the first conductor portion 21 and the second conductor portion 22 of the mounting substrate 2d by the first joint portion 31 formed from solder and the second joint portion 32 formed from solder.

In the second step described above, the first solder layer 41 and the second solder layer 42 are melted while applying heat and pressure appropriately in a condition where the first electrode 14 and the second electrode 15 of the LED chip 1d are respectively superposed on the first joint layer 71 and the second joint layer 72 of the mounting substrate 2d so as to contact the first joint layer 71 and the second joint layer 72. After melting the first solder layer 41 and the second solder layer 42 in the second step in the manner described above, the molten solder is pressed down so as to spread in the horizontal direction and fill the space 3 by applying pressure from the LED chip 1d side such that the protruding structure 16 contacts the second electrode 15. The molten solder is then cooled so as to coagulate.

Incidentally, the volume of the second joint layer 72 formed in the first process is preferably set to be equal to the volume of the space 3 so that the solder forming the second joint portion 32 does not flow out of the space 3.

In this method of manufacturing the light emitting device B3, the LED chip 1d is joined to the mounting substrate 2d while the first solder layer 41 and the second solder layer 42 are respectively in a molten condition by pressing down the molten solder so that the protruding structure 16 of the mounting substrate 2d contacts the surface 15a of the second electrode 15. Hence, according to this method of manufacturing the light emitting device B3, a situation in which the first electrode 14 is not joined to the first conductor portion 21 can be avoided.

In this method of manufacturing the light emitting device B3, the protruding structure 16 contacts the second electrode 15, the first electrode 14 and the first conductor portion 21 are joined by the first joint portion 31 formed from solder, and the second electrode 15 and the second conductor portion 22 are joined by the second joint portion 32 formed from solder. Hence, with this method of manufacturing the light emitting device B3, the second joint portion 32 can be formed to fill the space 3 surrounded by the second electrode 15, the protruding structure 16, and the second conductor portion 22. In this method of manufacturing the light emitting device B3, when the molten solder of the second joint layer 72 is pressed down so as to spread in the horizontal direction, the protruding structure 16 prevents the molten solder from flowing over the surface of the LED chip 1d. Hence, with this method of manufacturing the light emitting device B3, the solder can be prevented from causing a short circuit between the first electrode 14 and the second electrode 15. Moreover, according to this method of manufacturing the light emitting device B3, it is possible to manufacture the light emitting device B3 such that thermal resistance between the LED chip 1d and the mounting substrate 2d and variation therein can be reduced.

Figure 19:
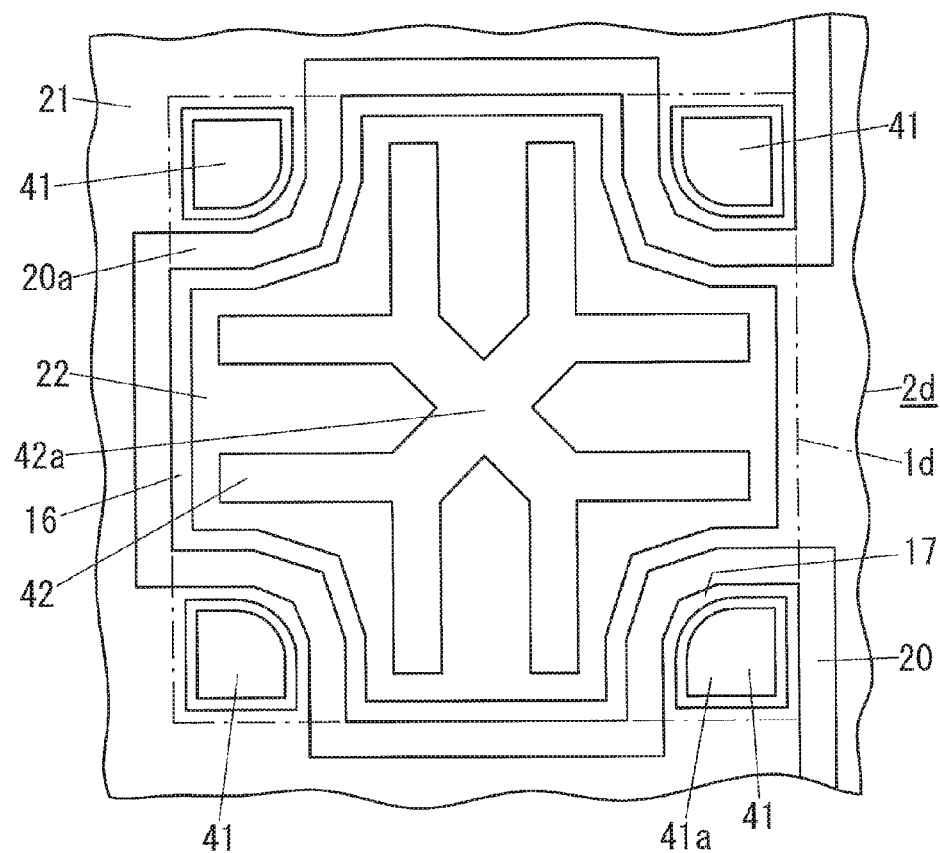
FIG. 19 is an illustrative view showing the method of manufacturing the light emitting device according to the second embodiment.

In this method of manufacturing the light emitting device B3, when the surface area of the second electrode 15 is larger than the surface area of the first electrode 14, unstable spreading is more likely to occur in the second joint portion 32 than in the first joint portion 31. Therefore, in this method of manufacturing the light emitting device B3, the second joint layer 72 is preferably formed in a predetermined pattern. The pattern of the second joint layer 72 may be modified as appropriate in accordance with the planar shape of the second electrode 15, but is preferably set in a radial shape such as that shown in FIGS. 17 and 19, for example, so that air bubbles are less likely to infiltrate. Hence, according to this method of manufacturing the light emitting device B3, the molten solder can be caused to spread out with stability when pressed down in the second step, and as a result, voids can be prevented from forming in the second joint portion 32.

Incidentally, in this method of manufacturing the light emitting device B3, a load is preferably applied to the protruding structure 16 such that the entire tip end surface thereof contacts the LED chip 1d. In this method of manufacturing the light emitting device B3, however, the flatness of the tip end surface of the protruding structure 16 differs from a flatness on the LED chip 1d side, making it difficult to ensure that the entire tip end surface of the protruding structure 16 contacts the LED chip 1d side. In the example shown in FIG. 18, a part of the second electrode 15 and a part of the insulating film 18 exist in an LED chip 1d side vertical projection region of the protruding structure 16, and therefore a difference is likely to occur between the flatness of the tip end surface of the protruding structure 16 and the flatness on the LED chip 1d side. In this case, the tip end surface of the protruding structure 16 may be brought partially into contact with the surface 15a of the second electrode 15 such that a thin solder layer constituted by hardened solder that infiltrates during manufacture remains between the remaining part of the tip end surface of the protruding structure 16 and the LED chip 1d. In other words, as long as the flatness of the LED chip 1d relative to the mounting substrate 2d is within a desired range, the light emitting device B3 may be configured such that the protruding structure 16 contacts the surface 15a of the second electrode 15 partially. In this method of manufacturing the light emitting device B3, the difference between the flatness of the tip end surface of the protruding structure 16 and the flatness on the LED chip 1d side can be reduced by increasing the load exerted in the second step, and in so doing, an area of contact between the protruding structure 16 and the second electrode 15 can be increased. In this method of manufacturing the light emitting device B3, when the protruding structure 16 is formed from metal or the like, for example, the protruding structure 16 can be deformed so as to be compressed by increasing the load exerted in the second step. Hence, according to this method of manufacturing the light emitting device B3, the area of contact between the protruding structure 16 and the second electrode 15 can be increased.

In this method of manufacturing the light emitting device B3, as described above, the first Au layer 61 and the second Au layer 62 are preferably formed on the first solder layer 41 and the second solder layer 42, respectively, in the first process. Hence, according to this method of manufacturing the light emitting device B3, the Sn of the first solder layer 41 and the second solder layer 42 can be prevented from oxidizing before the second process, enabling an improvement in the joint strength between the LED chip 1d and the mounting substrate 2d.

The respective constituent elements of the light emitting device B3 will be described below.

In the light emitting device B1 according to the first embodiment, shown in FIG. 1, the protruding structure 16 is formed on the LED chip 1a. In the light emitting device B3 according to this embodiment, on the other hand, the protruding structure 16 is formed on the mounting substrate 2d.

The mounting substrate 2d is substantially identical to the mounting substrate 2a of the light emitting device B1 according to the first embodiment, but differs therefrom in including the protruding structure 16. In other words, the mounting substrate 2d includes the support 20, the first conductor portion 21, the second conductor portion 22, and the protruding structure 16.

In the mounting substrate 2d, the first conductor portion 21 and the second conductor portion 22 are formed so as to be spatially removed from each other. As a result, regarding the mounting substrate 2d, the groove 23 is formed between the first conductor portion 21 and the second conductor portion 22. The inner surface of the groove 23 is constituted by a part of the first surface 20a of the support 20 and the opposing surfaces of the first conductor portion 21 and the second conductor portion 22. In the mounting substrate 2d, the first conductor portion 21 and the second conductor portion 22 are formed at identical thicknesses on the first surface 20a of the support 20. Hence, in the mounting substrate 2d, the surface 21a of the first conductor portion 21 and the surface 22a of the second conductor portion 22 are coplanar.

In the mounting substrate 2d, the protruding structure 16 is formed on the second conductor portion 22 so as to extend around the outer periphery of the second electrode 15, and protrudes on the side of the surface 22a of the second conductor portion 22. The mounting substrate 2d also includes a protruding structure 17 that surrounds the first joint portion 31. The protruding structure 17 protrudes from the surface 21a of the first conductor portion 21.

The LED chip 1d is configured substantially identically to the LED chip 1a (see FIGS. 1 and 3), but differs from the LED chip 1a in not including the protruding structures 16, 17. The LED chip 1d has an identical chip size to the LED chip 1a, but is not limited thereto.

In the LED chip 1d, the second electrode 15 is preferably larger than the first electrode 14. Further, the protruding structure 16 is preferably formed on the second conductor portion 22 so as to extend around the entire outer periphery of the second electrode 15. Thus, during manufacture of the light emitting device B3, the solder forming the second joint portion 32 can be prevented from causing a short circuit between the second electrode 15 and the first electrode 14 more effectively. Moreover, in the light emitting device B3, the shape of the second joint portion 32 can be reproduced more easily when mounting the LED chip 1d on the mounting substrate 2d, and therefore variation in the thermal resistance can be reduced.

The protruding structure 16 is preferably formed from an identical material to the part of the second conductor portion 22 that is joined to the second joint portion 32, and is preferably joined to the second joint portion 32. As a result, the radiation performance of the light emitting device B3 can be improved.

The protruding structure 16 is formed from an identical material to the Au film $22_3$ of the second conductor portion 22, for example. In other words, the protruding structure 16 is formed from Au. The protruding structure 16 can be formed using a vapor deposition method, a sputtering method, a plating method, and so on. In the light emitting device B3, in a case where the material of the protruding structure 16 is identical to the material of the Au film $22_3$ of the second conductor portion 22 and a structure combining the Au film $22_3$ of the second conductor portion 22 and the protruding structure 16 is formed using a vapor deposition method, for example, two separate vapor deposition operations should be performed.

The interval between the second electrode 15 and the second conductor portion 22 can be determined from the protrusion amount H11 of the protruding structure 16. In other words, the interval between the second electrode 15 and the second conductor portion 22 is substantially identical to the protrusion amount H11 of the protruding structure 16.

Hence, even when solder flows out of the space 3 during manufacture of the light emitting device B3, the flow speed of the outflowing solder can be reduced by the groove 23. Further, during manufacture of the light emitting device B3, a side face of the protruding structure 16 and the side face of the second conductor portion 22 can function as the solder guiding portion that guides the outflowing solder toward the first surface 20a side of the support 20. In the light emitting device B3, therefore, the solder flowing out of the space 3 can be prevented from causing a short circuit between the second electrode 15 and the first electrode 14.

Similarly to the LED chip 1a (see FIG. 1), the LED chip 1d preferably includes the insulating film 18, which is formed on the surface 12a of the second conductive semiconductor layer 12 so as to surround the contact region of the second electrode 15 in which the second electrode 15 contacts the second conductive semiconductor layer 12.

In the LED chip 1d, the insulating film 18 is preferably formed to extend over the mesa structure surface 19a (the surface 12a of the second conductive semiconductor layer 12), the side face 19c, and the surface 11a of the first conductive semiconductor layer 11. The part of the insulating film 18 formed on the surface 11a of the first conductive semiconductor layer 11 is preferably formed in a pattern that surrounds the contact region of the first electrode 14 in which the first electrode 14 contacts the first conductive semiconductor layer 11.

Incidentally, in the method of manufacturing the light emitting device B3 described above, the second joint layer 72 (see FIGS. 16 and 18) uses a larger amount of solder than the first joint layer 71 (see FIGS. 16 and 18), and the thickness thereof varies more greatly during the second process. With this method of manufacturing the light emitting device B3, therefore, a larger amount of molten solder is pressed down on the second joint layer 72 than on the first joint layer 71, and as a result, solder is more likely to flow out of the space 3 due to the variation in the thickness of the second joint layer 72 and so on.

In the light emitting device B3, the respective thicknesses of the first conductor portion 21 and the second conductor portion 22 are preferably greater than the interval between the second electrode 15 and the second conductor portion 22. Hence, in the light emitting device B3, the solder that flows out of the space 3 can be absorbed by the groove 23, and the solder that flows out of the space 3 can be prevented from causing a short circuit between the second electrode 15 and the first electrode 14 even more effectively.

Figure 20:
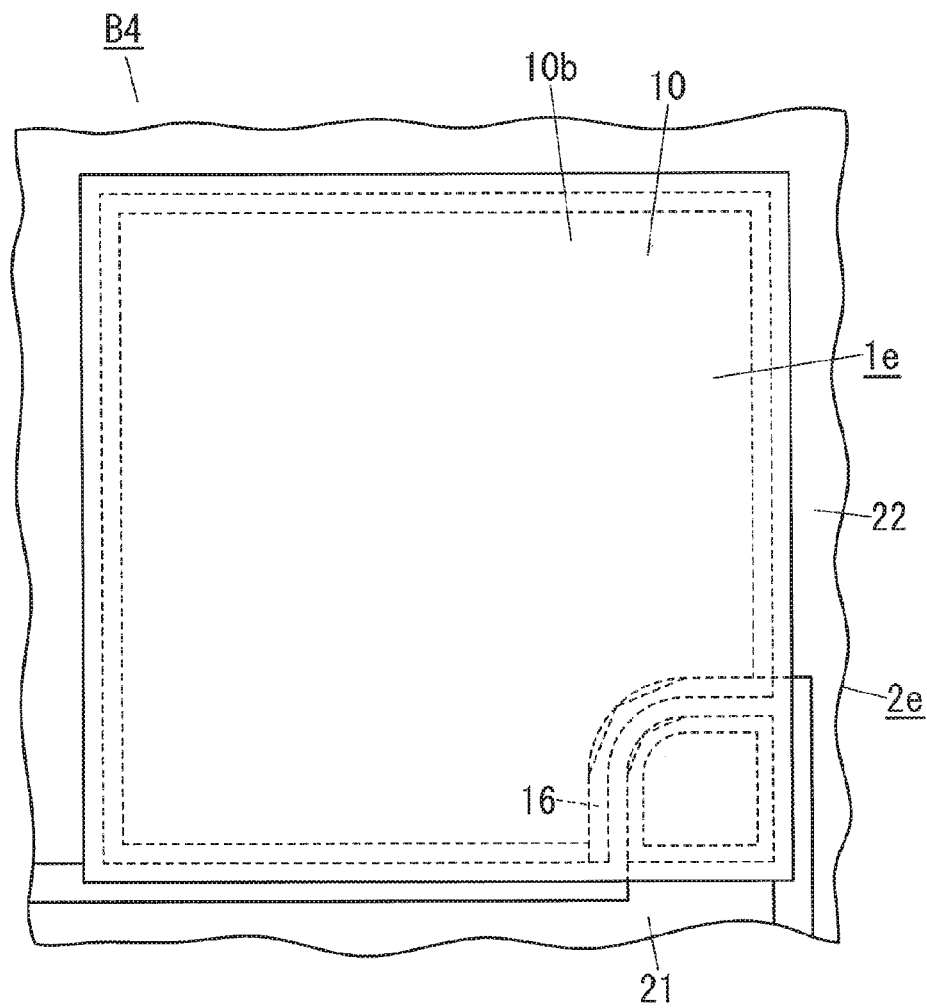
FIG. 20 is a schematic plan view showing main parts of a first modified example of the light emitting device according to the second embodiment.
Figure 21:
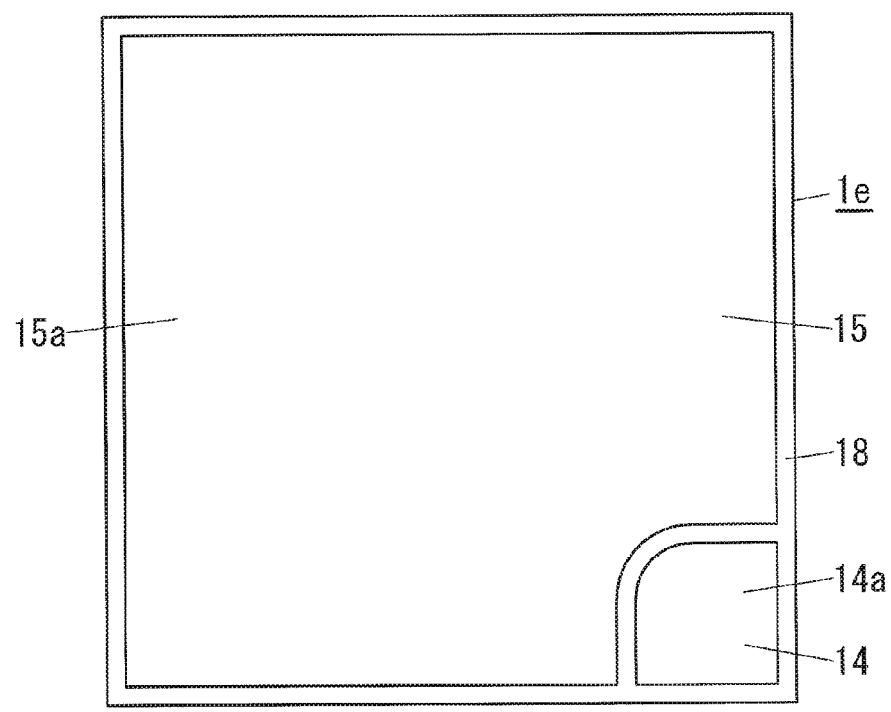
FIG. 21 is a schematic plan view showing an LED chip employed in the first modified example of the light emitting device according to the second embodiment.
Figure 22:
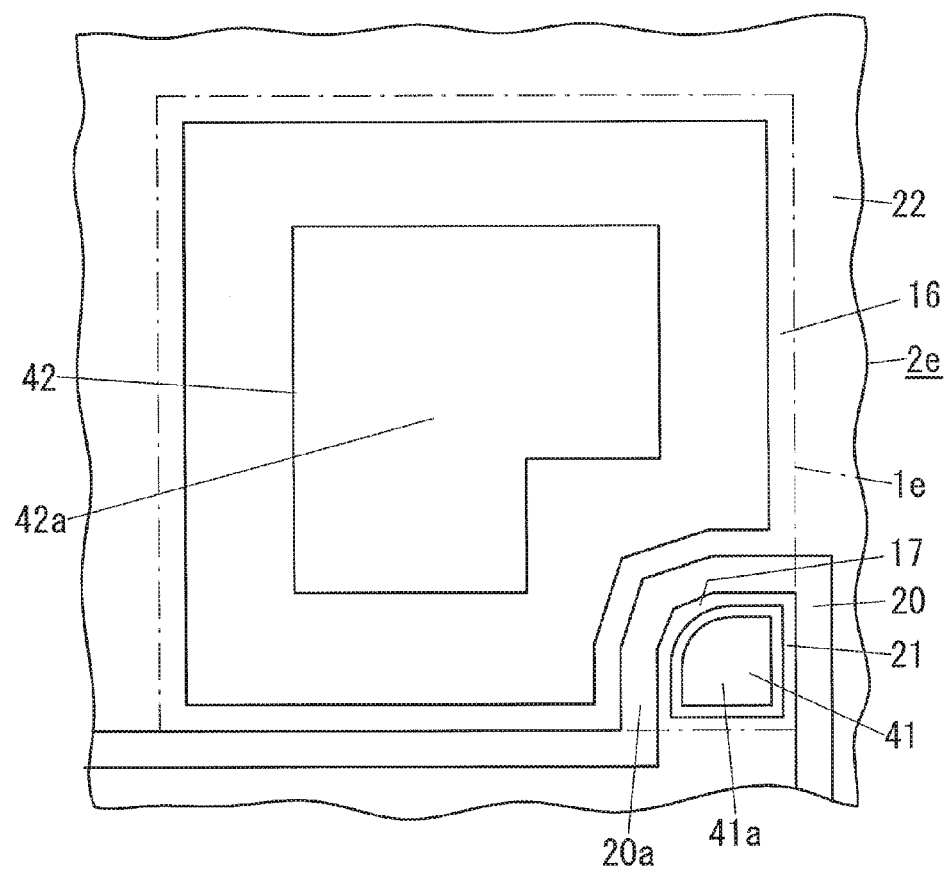
FIG. 22 is an illustrative view showing a method of manufacturing the first modified example of the light emitting device according to the second embodiment.

FIG. 20 is a schematic plan view showing main parts of a light emitting device B4 serving as a first modified example of the light emitting device B3 according to this embodiment. The light emitting device B4 has a substantially identical basic configuration to the light emitting device B3. The light emitting device B4 differs from the light emitting device B3 only in the respective shapes of the first electrode 14 and the second electrode 15 provided on an LED chip 1e (see FIG. 21), the respective shapes of the first conductor portion 21 and the second conductor portion 22 provided on a mounting substrate 2e (see FIG. 22), and so on. Accordingly, a detailed description of the light emitting device B4 has been omitted. Note that constituent elements of the light emitting device B4 that are identical to their counterparts in the light emitting device B3 have been allocated identical reference symbols.

The LED chip 1e has a smaller chip size than the LED chip 1d (see FIGS. 13 and 15). In the LED chip 1d, the surface 11a of the first conductive semiconductor layer 11 is exposed from each of the four corners of the semiconductor multilayer film 19, and the first electrode 14 is formed on each surface 11a. Hence, the LED chip 1d includes four first electrodes 14. In the LED chip 1e, on the other hand, the surface 11a of the first conductive semiconductor layer 11 is exposed from one of the four corners of the semiconductor multilayer film 19, and the first electrode 14 is formed on the exposed surface 11a. Hence, the LED chip 1e differs from the LED chip 1d in the shape of the second electrode 15.

Figure 23:
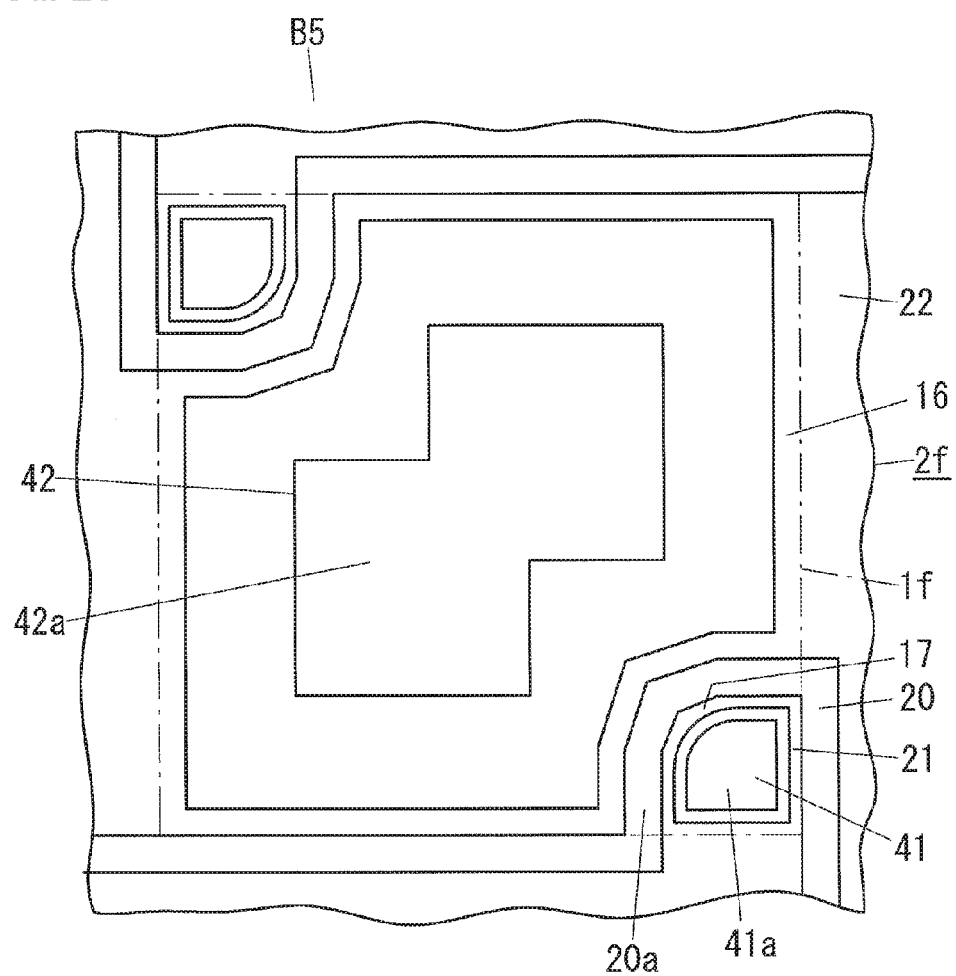
FIG. 23 is an illustrative view showing a method of manufacturing a second modified example of the light emitting device according to the second embodiment.

FIG. 23 is a schematic plan view showing main parts of a light emitting device B5 serving as a second modified example of the light emitting device B3 according to this embodiment. The light emitting device B5 has a substantially identical basic configuration to the light emitting device B3. The light emitting device B5 differs from the light emitting device B3 only in the respective shapes of the first electrode 14 and the second electrode 15 provided on an LED chip 1f (see FIG. 24), the respective shapes of the first conductor portion 21 and the second conductor portion 22 provided on a mounting substrate 2f (see FIG. 23), and so on. Accordingly, a detailed description of the light emitting device B5 has been omitted. Note that constituent elements of the light emitting device B5 that are identical to their counterparts in the light emitting device B3 have been allocated identical reference symbols.

Figure 24:
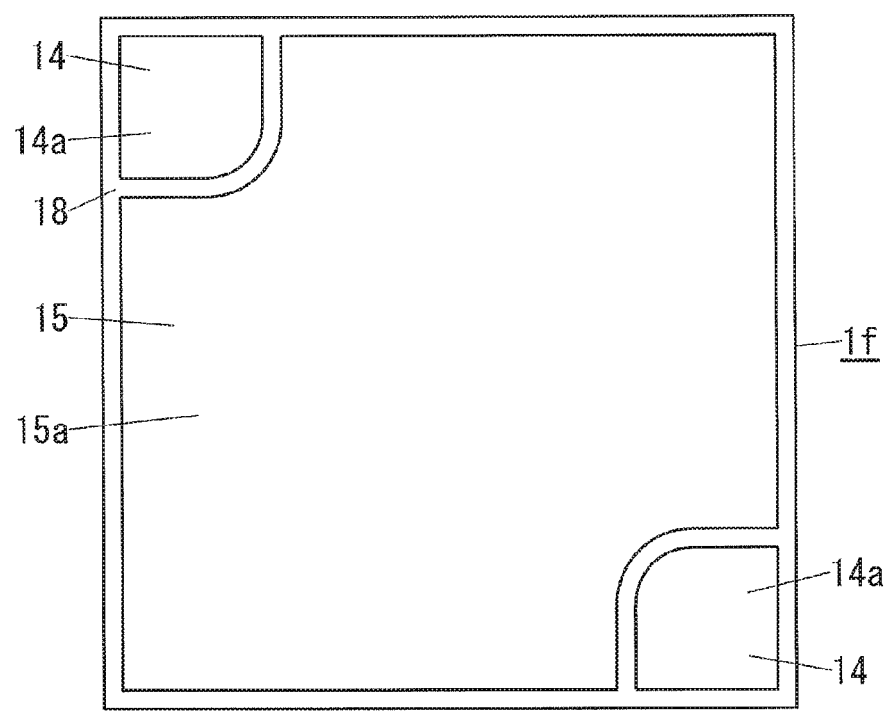
FIG. 24 is a schematic plan view showing an LED chip employed in the second modified example of the light emitting device according to the second embodiment.

The LED chip 1f has a smaller chip size than the LED chip 1d (see FIGS. 13 and 15) and a larger chip size than the LED chip 1e (see FIGS. 23 and 24). In the LED chip 1f, the surface 11a of the first conductive semiconductor layer 11 is exposed from two of the four corners of the semiconductor multilayer film 19, and the first electrode 14 is formed on each of the exposed surfaces 11a. Hence, the LED chip 1f includes two first electrodes 14, and differs from the LED chips 1d, 1e in the shape of the second electrode 15.

Figure 25:
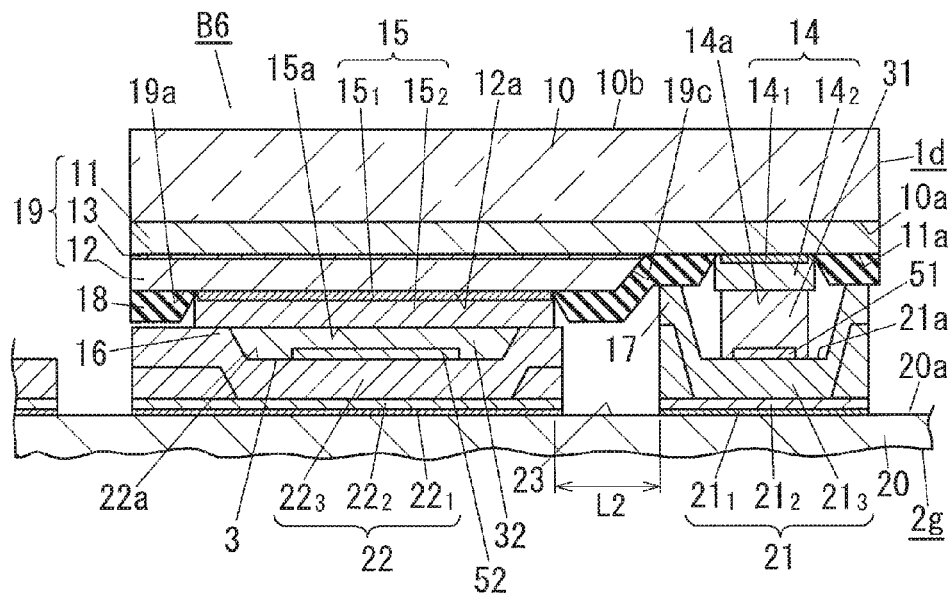
FIG. 25 is a schematic sectional view showing main parts of a third modified example of the light emitting device according to the second embodiment.

FIG. 25 is a schematic sectional view showing main parts of a light emitting device B6 serving as a third modified example of the light emitting device B3 according to this embodiment. The light emitting device B6 has a substantially identical basic configuration to the light emitting device B3. The light emitting device B6 differs from the light emitting device B3 only in the shape of the protruding structure 17 provided on a mounting substrate 2g. Accordingly, a detailed description of the light emitting device B6 has been omitted. Note that constituent elements of the light emitting device B6 that are identical to their counterparts in the light emitting device B3 have been allocated identical reference symbols.

In the light emitting device B6, a protrusion amount of the protruding structure 17 is set such that a tip end surface of the protruding structure 17 contacts the LED chip 1d side. More specifically, in the light emitting device B6, the protrusion amount of the protruding structure 17 is set such that the tip end surface of the protruding structure 17 contacts the surface of the insulating film 18 of the LED chip 1d in a part thereof formed on the periphery of the first electrode 14. Hence, in the light emitting device B6, a spreading range of the first joint portion 31 can be limited, and as a result, a short circuit between the first electrode 14 and the second electrode 15 can be prevented even more effectively.

The light emitting device B6 is configured as follows.

The light emitting device B6 includes the mounting substrate 2g and the LED chip 1d mounted on the mounting substrate 2g. The mounting substrate 2g includes the support 20, and the first conductor portion 21 and second conductor portion 22 that are supported by the support 20 such that the LED chip 1d is electrically connected thereto. The LED chip 1d includes the substrate 10, the first conductive semiconductor layer 11 formed on the side of the first surface 10a of the substrate 10, and the second conductive semiconductor layer 12 formed on the opposite side of the first conductive semiconductor layer 11 to the substrate 10. The LED chip 1d also includes the first electrode 14 formed on the surface 11a of the first conductive semiconductor layer 11 that is exposed to the opposite side to the substrate 10, and the second electrode 15 formed on the surface 12a of the second conductive semiconductor layer 12. Further, the light emitting device B6 includes the protruding structure 16 that protrudes from one of the side of the surface 12a of the second conductive semiconductor layer 12 and the side of the surface 22a of the second conductor portion 22 toward the other side so as to contact the other side, and is positioned so as to extend around the outer periphery of the second electrode 15. Furthermore, in the light emitting device B6, the first electrode 14 and the first conductor portion 21 are joined to each other by the first joint portion 31 formed from solder, while the second electrode 15 and the second conductor portion 22 are joined to each other by the second joint portion 32 formed from solder. The second joint portion 32 is formed so as to fill the space 3 surrounded by the second electrode 15, the protruding structure 16, and the second conductor portion 22. The LED chip 1d includes the insulating film 18, which is formed on the surface 12a of the second conductive semiconductor layer 12 so as to surround the contact region of the second electrode 15 in which the second electrode 15 contacts the second conductive semiconductor layer 12. The insulating film 18 is formed from SiO₂.

The protruding structure 16 of the light emitting device B6 is formed on the second conductor portion 22 so as to extend around the outer periphery of the second electrode 15, and protrudes further on the side of the surface 22a of the second conductor portion 22 than the periphery thereof on the mounting substrate 2g.

In addition to a first protruding structure constituted by the protruding structure 16, the mounting substrate 2g of the light emitting device B6 includes the protruding structure 17 (referred to hereafter as a "second protruding structure 17") that surrounds the first joint portion 31. The second protruding structure 17 protrudes from the surface 21a of the first conductor portion 21 so as to contact the LED chip 1d. The insulating film 18 covers a region of the surface 11a of the first conductive semiconductor layer 11 in which the first electrode 14 is not formed. The tip end surface of the second protruding structure 17 contacts the surface of the insulating film 18 in the part thereof formed on the periphery of the first electrode 14. Hence, in the light emitting device B6, the spreading range of the first joint portion 31 can be limited, and as a result, a short circuit between the first electrode 14 and the second electrode 15 can be prevented even more effectively.

The solder forming the first joint portion 31 and the solder forming the second joint portion 32 are preferably constituted by AuSn.

Figure 26:
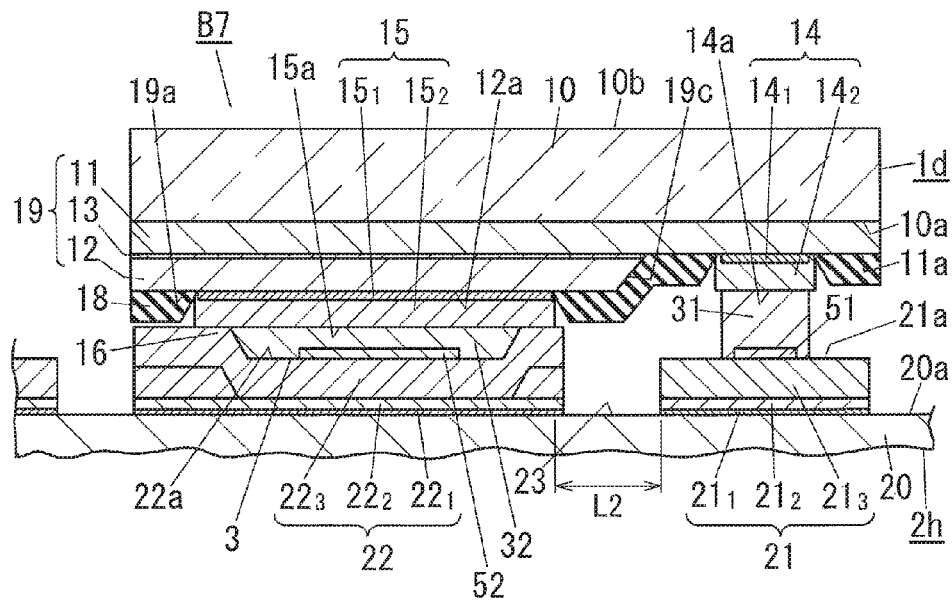
FIG. 26 is a schematic sectional view showing main parts of a fourth modified example of the light emitting device according to the second embodiment.

FIG. 26 is a schematic sectional view showing main parts of a light emitting device B7 serving as a fourth modified example of the light emitting device B3 according to this embodiment. The light emitting device B7 has a substantially identical basic configuration to the light emitting device B3. The light emitting device B7 differs from the light emitting device B3 only in that a mounting substrate 2h does not include the protruding structure 17 (see FIG. 13). Accordingly, a detailed description of the light emitting device B7 has been omitted. Note that constituent elements of the light emitting device B7 that are identical to their counterparts in the light emitting device B3 have been allocated identical reference symbols.

The light emitting device B7 does not include the protruding structure 17 of the light emitting device B3, and therefore the manufacturing process thereof can be simplified in comparison with the light emitting device B3.

Figure 27:
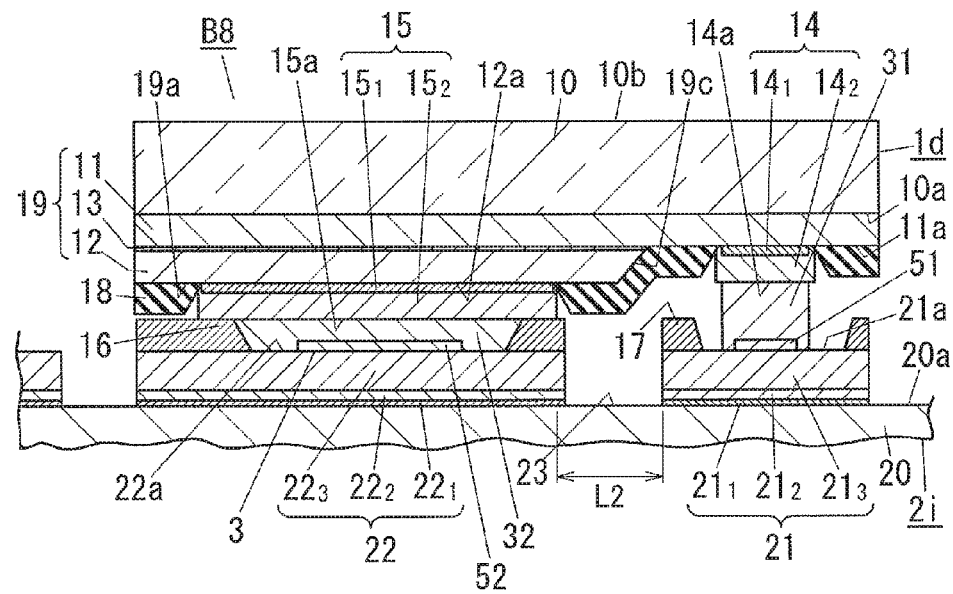
FIG. 27 is a schematic sectional view showing main parts of a fifth modified example of the light emitting device according to the second embodiment.

FIG. 27 is a schematic sectional view showing main parts of a light emitting device B8 serving as a fifth modified example of the light emitting device B3 according to this embodiment. The light emitting device B8 has a substantially identical basic configuration to the light emitting device B3. The light emitting device B8 differs from the light emitting device B3 only in the material of the protruding structures 16, 17 provided on a mounting substrate 2i. Accordingly, a detailed description of the light emitting device B8 has been omitted. Note that constituent elements of the light emitting device B8 that are identical to their counterparts in the light emitting device B3 have been allocated identical reference symbols.

The protruding structure 16 of the light emitting device B8 has a lower solder wettability than the second conductor portion 22, and is not joined to the second joint portion 32. Hence, in the light emitting device B8, the solder forming the second joint portion 32 can be more reliably prevented from flowing out of the space 3, and as a result, a short circuit between the first electrode 14 and the second electrode 15 can be prevented even more effectively.

The solder wettability of the second conductor portion 22 refers to the solder wettability of the part of the second conductor portion 22 that is joined to the second joint portion 32. Accordingly, the solder wettability of the second conductor portion 22 refers to the solder wettability of the Au film $22_3$ of the second conductor portion 22.

The solder wettability of the protruding structure 16 refers to the solder wettability of the tip end side and respective side face sides of the protruding structure 16.

The protruding structure 16 may be formed from an Al film and an aluminum oxide film formed on the surface of the Al film, for example. The aluminum oxide film has a lower solder wettability than the Au film $22_3$, and is therefore solder repellent. Alternatively, the protruding structure 16 may be formed from a Ni film and a nickel oxide film formed on the surface of the Ni film, for example. The nickel oxide film has a lower solder wettability than the Au film $22_3$, and is therefore solder repellent. The protruding structure 16 may also be formed from an aluminum oxide film, a nickel oxide film, a silicon oxide film, and so on, for example. The silicon oxide film has a lower solder wettability than the Au film $22_3$, and is therefore solder repellent.

Figure 28:
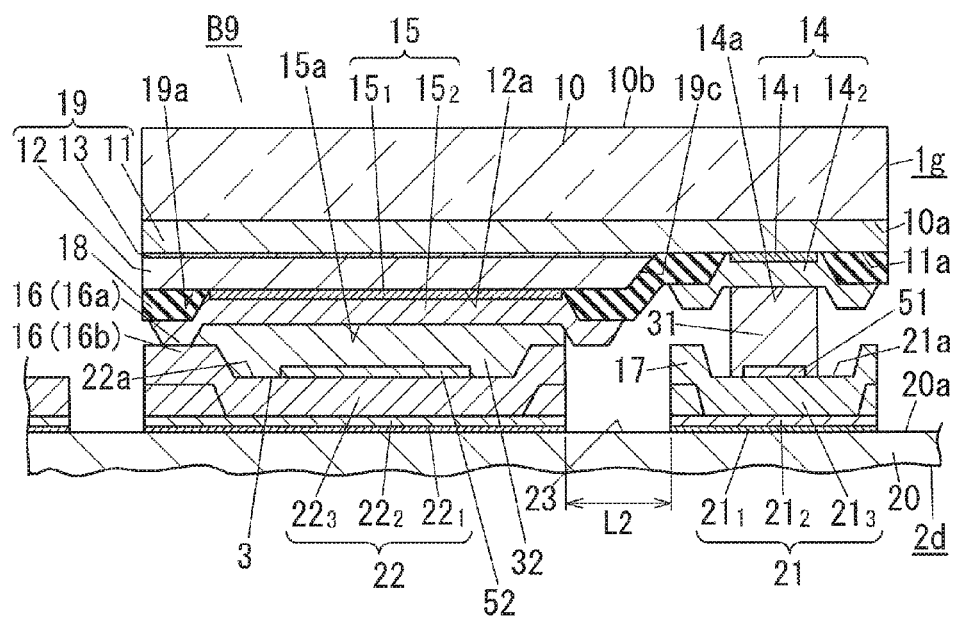
FIG. 28 is a schematic sectional view showing main parts of a sixth modified example of the light emitting device according to the second embodiment.

FIG. 28 is a schematic sectional view showing main parts of a light emitting device B9 serving as a sixth modified example of the light emitting device B3 according to this embodiment. The light emitting device B9 has a substantially identical basic configuration to the light emitting device B3. The light emitting device B9 differs only in that an LED chip 1g includes the protruding structure 16. Accordingly, a detailed description of the light emitting device B9 has been omitted. Note that constituent elements of the light emitting device B9 that are identical to their counterparts in the light emitting device B3 have been allocated identical reference symbols.

The light emitting device B9 includes protruding structures 16, 16 that protrude respectively from the side of the surface 12a of the second conductive semiconductor layer 12 and the side of the surface 22a of the second conductor portion 22 toward the other side so as to contact the other side, and are positioned so as to extend around the outer periphery of the second electrode 15. In the light emitting device B9, respective tip end surfaces of the protruding structure 16 (16b) formed on the mounting substrate 2d and the protruding structure 16 (16a) formed on the LED chip 1g contact each other. The protruding structure 16a of the LED chip 1g is structured similarly to that of the LED chip 1a (see FIG. 1).

In the light emitting device B9, the first electrode 14 and the first conductor portion 21 are joined to each other by the first joint portion 31 formed from solder, while the second electrode 15 and the second conductor portion 22 are joined to each other by the second joint portion 32 formed from solder. The second joint portion 32 is formed so as to fill the space 3 surrounded by the second electrode 15, the protruding structures 16a, 16b, and the second conductor portion 22. With the light emitting device B9, similarly to the light emitting device B3, the thermal resistance between the LED chip 1g and the mounting substrate 2d can be reduced.

Figure 29:
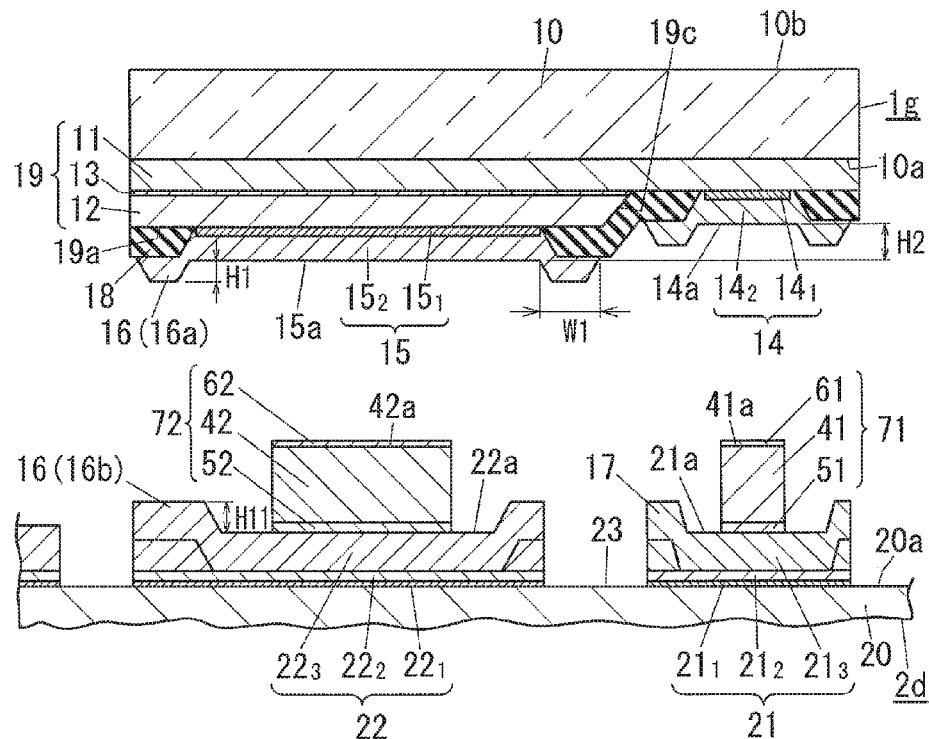
FIG. 29 is an illustrative view showing a method of manufacturing the sixth modified example of the light emitting device according to the second embodiment.

To manufacture the light emitting device B9, as shown in FIG. 29, the LED chip 1g and the mounting substrate 2d are opposed, whereupon the first and second electrodes 14, 15 of the LED chip 1g are joined respectively to the first and second conductor portions 21, 22 of the mounting substrate 2d by the first and second joint portions 31, 32.

The respective thicknesses of the first solder layer 41 and the second solder layer 42 are set to exceed, by the predetermined thickness ($\alpha$), a sum (H1+H11+H2) of the protrusion amount H1 by which the protruding structure 16a protrudes from the surface 15a of the second electrode 15, the protrusion amount H11 by which the protruding structure 16b protrudes from the surface 22a of the second conductor portion 22, and the step H2 between the second electrode 15 and the first electrode 14 in the thickness direction of the LED chip 1d. In other words, the respective thicknesses of the first solder layer 41 and the second solder layer 42 are set at H1+H11+H2+$\alpha$. When H1=1 µm, H11=1 µm, and H2=1 µm, for example, the respective thicknesses of the first solder layer 41 and the second solder layer 42 may be set at approximately 4 µm. In this case, $\alpha$=1 µm. These numerical values are merely examples, and there are no particular limitations thereon.

Third Embodiment

Figure 30:
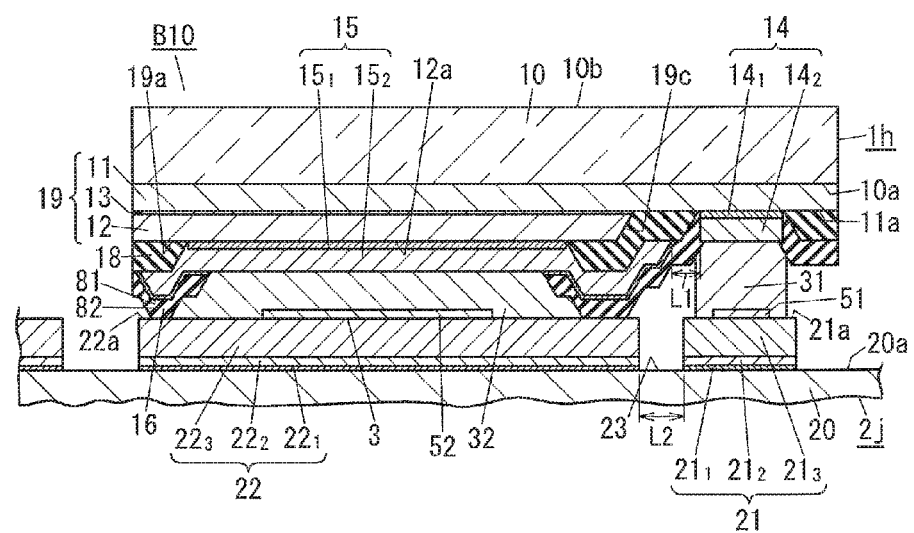
FIG. 30 is a schematic sectional view showing main parts of a light emitting device according to a third embodiment.
Figure 31:
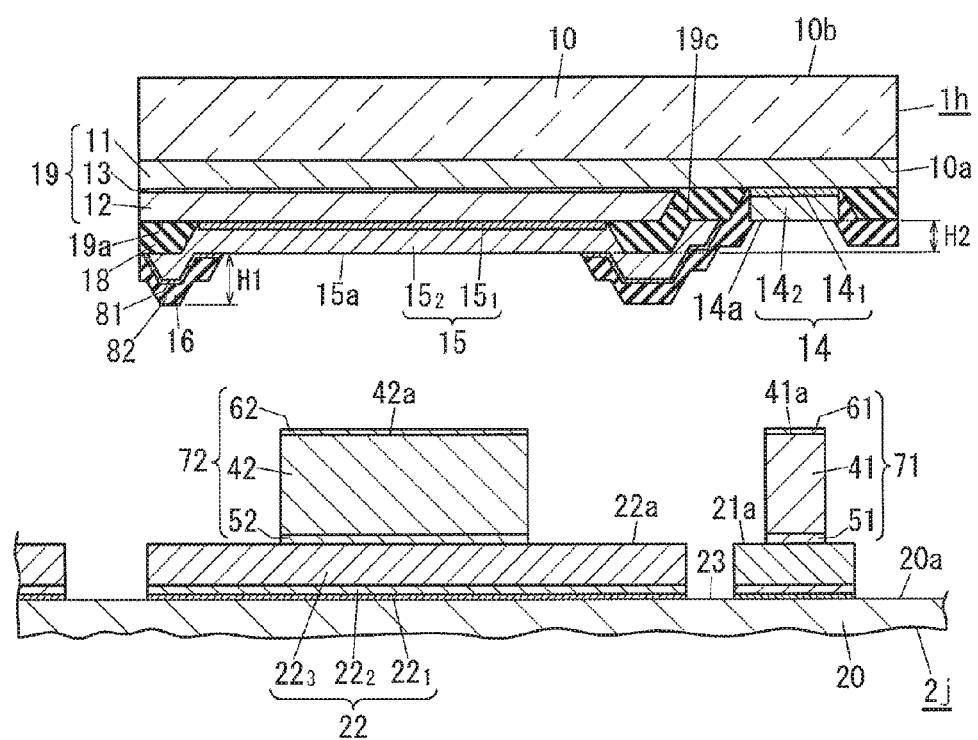
FIG. 31 is an illustrative view showing a method of manufacturing the light emitting device according to the third embodiment.
Figure 32:
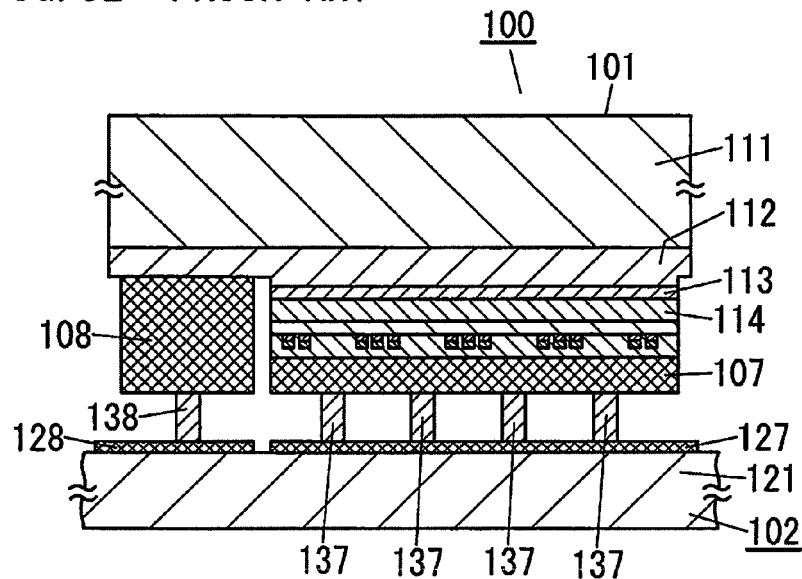
FIG. 32 is a schematic sectional view showing a conventional example of a light emitting device.
Figure 33:
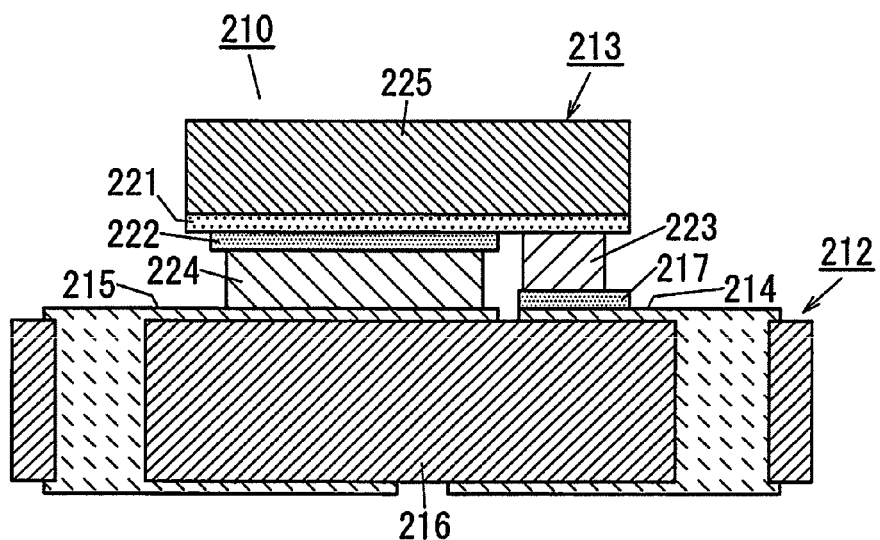
FIG. 33 is a schematic sectional view showing a conventional example of an LED device.

A light emitting device B10 according to this embodiment will be described below on the basis of FIGS. 30 and 31. Note that constituent elements of the light emitting device B10 that are identical to their counterparts in the light emitting device B1 according to the first embodiment have been allocated identical reference symbols, and where appropriate, description thereof has been omitted.

The light emitting device B10 includes an LED chip 1*h* in place of the LED chip 1*a* of the light emitting device B1 according to the first embodiment, and includes a mounting substrate 2*j* in place of the mounting substrate 2*a* of the light emitting device B1 according to the first embodiment. Note that constituent elements of the LED chip 1*h* that are identical to their counterparts in the LED chip 1*a* have been allocated identical reference symbols, and where appropriate, description thereof has been omitted. Further, constituent elements of the mounting substrate 2*j* that are identical to their counterparts in the mounting substrate 2*a* have been allocated identical reference symbols, and where appropriate, description thereof has been omitted.

The LED chip 1*h* includes the insulating film 18 (referred to hereafter as the "first insulating film 18"), which is formed on the surface 12*a* of the second conductive semiconductor layer 12 so as to surround the contact region of the second electrode 15 in which the second electrode 15 contacts the second conductive semiconductor layer 12. In the LED chip 1*h*, the second electrode 15 is formed to extend over the surface 12*a* of the second conductive semiconductor layer 12 and the surface of the first insulating film 18. The LED chip 1*h* further includes: a second insulating film 82 that covers an end portion of the first electrode 14, an end portion of the second electrode 15, and the first insulating film 18; and an adhesive layer 81 interposed between the second insulating film 82 and the end portion of the first electrode 14 and between the second insulating film 82 and the end portion of the second electrode 15. The adhesive layer 81 adheres to the second insulating film 82 more favorably than the second electrode 15. The second insulating film 82 adheres to the first insulating film 18 more favorably than the second electrode 15. The second insulating film 82 doubles as the protruding structure 16. Hence, in the light emitting device B10, the second insulating film 82 functions as a protective film that protects the respective end portions of the first and second electrodes 14, 15, which peel away easily, and also functions as the protruding structure 16. Therefore, in the light emitting device B10, corrosion can be prevented from advancing from the vicinity of the end portion of the first electrode 14 and the vicinity of the end portion of the second electrode 15, and as a result, an improvement in reliability can be achieved. Moreover, in the light emitting device B10, the protrusion amount H1 of the protruding structure 16 can be secured more easily than in the light emitting device B1 according to the first embodiment. The second insulating film 82 is an electrical insulating film having an electrical insulating property.

Further, in the LED chip 1*h*, when the second electrode 15 is provided to extend onto the step portion on the side of the first electrode 14, the thickness of the second electrode 15 decreases on the step portion, with the result that the step is more likely to break. In the LED chip 1*h*, when the step breaks in the extending part of the second electrode 15, the location of the step breakage may serve as a start point of corrosion. In the LED chip 1*h*, therefore, the second insulating film 82 is preferably formed to cover the part of the second electrode 15 that extends onto the step portion. In so doing, the reliability of the light emitting device B10 can be improved.

The second insulating film 82 preferably covers a part of the first electrode 14 that is adjacent to the second electrode 15 within a range of the part joined to the first joint portion 31. Hence, in the light emitting device B10, even when solder flows out of the space 3, the outflowing solder can be prevented from contacting the first electrode 14 so as to cause a short circuit. As a result, improvements in manufacturing yield and reliability can be achieved.

The first insulating film 18 is preferably a silicon oxide film. Further, the second insulating film 82 is preferably a silicon nitride film. Furthermore, the material of the adhesive layer 81 is preferably one type selected from a group consisting of Ti, Cr, Nb, Zr, TiN, and TaN. By configuring the light emitting device B10 in this manner, the second insulating film 82 can function as a passivation film, enabling an improvement in reliability.

In a first modified example of the light emitting device B10, the first electrode 14 is disposed to surround the outer periphery of the second electrode 15 in planar view. In the first modified example of the light emitting device B10 in particular, the second insulating film 82 preferably covers the part of the first electrode 14 that is adjacent to the second electrode 15 within the range of the part joined to the first joint portion 31.

The diagrams described above in the first to third embodiments and so on are pattern diagrams, and ratios between respective sizes and thicknesses of the constituent elements do not necessarily reflect actual dimensional ratios. Further, the materials, numerical values, and so on described in the first to third embodiment are merely preferred examples, and the present invention is not limited thereto. Moreover, appropriate modifications may be applied to the configurations of the present invention within a range that does not depart from the scope of the technical spirit thereof.

As is evident from the description provided above in the first to third embodiments and so on, a light emitting device of a first aspect according to the present invention includes a mounting substrate and an LED chip mounted on the mounting substrate. The mounting substrate includes: a support; and a first conductor portion and a second conductor portion that are supported by the support such that the LED chip is electrically connected thereto. The LED chip includes: a substrate; a first conductive semiconductor layer formed on a side of a first surface of the substrate; a second conductive semiconductor layer formed on an opposite side of the first conductive semiconductor layer to the substrate; a first electrode formed on a surface of the first conductive semiconductor layer that is exposed to an opposite side to the substrate; and a second electrode formed on a surface of the second conductive semiconductor layer. The light emitting device further includes a protruding structure that protrudes from a side of the surface of the second conductive semiconductor layer toward a side of a surface of the second conductor portion so as to contact the surface of the second conductor portion, and is positioned so as to extend around an outer periphery of the second electrode. The first electrode and the first conductor portion are joined to each other by a first joint portion formed from solder. The second electrode and the second conductor portion are joined to each other by a second joint portion formed from solder. The second joint portion is formed so as to fill a space surrounded by the second electrode, the protruding structure, and the second conductor portion. The protruding structure is disposed to extend around the outer periphery of the second electrode so as to surround the second joint portion in planar view. A part of the mounting substrate that overlaps the protruding structure in planar view is either identical in height to or lower than a part of the second conductor portion that is joined to the second joint portion.

Regarding the light emitting device of a second aspect, in the first aspect, only the first joint portion is interposed between the LED chip and the first conductor portion in a thickness direction of the LED chip.

Regarding the light emitting device of a third aspect, in the first or second aspect, the protruding structure is formed to extend around the outer periphery of the second electrode of the LED chip, and protrudes further on the side of the surface of the second conductive semiconductor layer than a periphery thereof on the LED chip.

Regarding the light emitting device of a fourth aspect, in the third aspect, in the LED chip, the second electrode is larger than the first electrode, and the protruding structure is formed to extend entirely around the outer periphery of the second electrode.

Regarding the light emitting device of a fifth aspect, in any one of the first to fourth aspects, on the mounting substrate, respective thicknesses of the first conductor portion and the second conductor portion are greater than an interval between the second electrode and the second conductor portion.

Regarding the light emitting device of a sixth aspect, in any one of the first to fifth aspects, the LED chip further includes an insulating film formed on the surface of the second conductive semiconductor layer so as to surround a contact region of the second electrode in which the second electrode contacts the second conductive semiconductor layer, the second electrode is formed to extend over the surface of the second conductive semiconductor layer and a surface of the insulating film, and an outer peripheral portion of the second electrode, which protrudes beyond a central portion thereof in a direction heading away from the second conductive semiconductor layer, doubles as the protruding structure.

Regarding the light emitting device of a seventh aspect, in any one of the first to fifth aspects, the LED chip further includes an insulating film formed on the surface of the second conductive semiconductor layer so as to surround a contact region of the second electrode in which the second electrode contacts the second conductive semiconductor layer, and the insulating film doubles as the protruding structure.

Regarding the light emitting device of an eighth aspect, in any one of the first to fifth aspects, the LED chip further includes a first insulating film formed on the surface of the second conductive semiconductor layer so as to surround a contact region of the second electrode in which the second electrode contacts the second conductive semiconductor layer. The second electrode is formed to extend over the surface of the second conductive semiconductor layer and a surface of the first insulating film. The LED chip further includes: a second insulating film that covers an end portion of the first electrode, an end portion of the second electrode, and the first insulating film; and an adhesive layer interposed between the second insulating film and the end portion of the first electrode and between the second insulating film and the end portion of the second electrode. The adhesive layer adheres to the second insulating film more favorably than the second electrode. The second insulating film adheres to the first insulating film more favorably than the second electrode. The second insulating film doubles as the protruding structure.

Regarding the light emitting device of a ninth aspect, in the eighth aspect, the second insulating film covers a part of the first electrode that is adjacent to the second electrode within a range of a part thereof that is joined to the first joint portion.

Regarding the light emitting device of a tenth aspect, the first insulating film is a silicon oxide film, the second insulating film is a silicon nitride film, and a material of the adhesive layer is one type selected from a group consisting of Ti, Cr, Nb, Zr, TiN, and TaN.

Regarding the light emitting device of an eleventh aspect, in any one of the first to tenth aspects, AuSn is used as the solder forming the first joint portion and the solder forming the second joint portion.

Regarding the light emitting device of a twelfth aspect, in any one of the first to eleventh aspects, an interval between the first conductor portion and the second conductor portion is wider than an interval between the first electrode and the second electrode.

Regarding the light emitting device of a thirteenth aspect, in the twelfth aspect, a first conductor portion side end of the second conductor portion is set further back than a first electrode side end of the second electrode in order to make the interval between the first conductor portion and the second conductor portion wider than the interval between the first electrode and the second electrode.

Regarding the light emitting device of a fourteenth aspect, in any one of the first to thirteenth aspects, the second joint portion includes, in addition to a part thereof formed from solder, a barrier layer formed on the surface of the second conductor portion. The barrier layer functions as a diffusion barrier. The barrier layer of the second joint portion is formed on an inner side of the protruding structure and at a remove from the protruding structure. The part of the second joint portion formed from solder is formed to cover a part of the surface of the second conductor portion in which the barrier layer is not formed, as well as a front surface and respective side faces of the barrier layer.

A light emitting device of a fifteenth aspect includes a mounting substrate and an LED chip mounted on the mounting substrate. The mounting substrate includes: a support; and a first conductor portion and a second conductor portion that are supported by the support such that the LED chip is electrically connected thereto. The LED chip includes: a substrate; a first conductive semiconductor layer formed on a side of a first surface of the substrate; a second conductive semiconductor layer formed on an opposite side of the first conductive semiconductor layer to the substrate; a first electrode formed on a surface of the first conductive semiconductor layer that is exposed to an opposite side to the substrate; and a second electrode formed on a surface of the second conductive semiconductor layer. The light emitting device includes a protruding structure that protrudes from at least one of the side of the surface of the second conductive semiconductor layer and a side of a surface of the second conductor portion toward the other side so as to contact the other side, and is positioned so as to extend around an outer periphery of the second electrode. The first electrode and the first conductor portion are joined to each other by a first joint portion formed from solder. The second electrode and the second conductor portion are joined to each other by a second joint portion formed from solder. The second joint portion is formed so as to fill a space surrounded by the second electrode, the protruding structure, and the second conductor portion.

Regarding the light emitting device of a sixteenth aspect, in the fifteenth aspect, the protruding structure is formed to extend around the outer periphery of the second electrode of the LED chip, and protrudes further on the side of the surface of the second conductive semiconductor layer than a periphery thereof on the LED chip.

Regarding the light emitting device of a seventeenth aspect, in the sixteenth aspect, on the LED chip, the second electrode is larger than the first electrode, and the protruding structure is formed to extend entirely around the outer periphery of the second electrode.

Regarding the light emitting device of an eighteenth aspect, in the sixteenth or seventeenth aspect, on the mounting substrate, respective thicknesses of the first conductor portion and the second conductor portion are greater than an interval between the second electrode and the second conductor portion.

Regarding the light emitting device of a nineteenth aspect, in any one of the sixteenth to eighteenth aspects, the LED chip includes an insulating film formed on the surface of the second conductive semiconductor layer so as to surround a contact region of the second electrode in which the second electrode contacts the second conductive semiconductor layer. The second electrode is formed to extend over the surface of the second conductive semiconductor layer and a surface of the insulating film. An outer peripheral portion of the second electrode, which protrudes beyond a central portion thereof in a direction heading away from the second conductive semiconductor layer, doubles as the protruding structure.

Regarding the light emitting device of a twentieth aspect, in any one of the sixteenth to eighteenth aspects, the LED chip includes an insulating film formed on the surface of the second conductive semiconductor layer so as to surround a contact region of the second electrode in which the second electrode contacts the second conductive semiconductor layer. The insulating film doubles as the protruding structure.

Regarding the light emitting device of a twenty-first aspect, in the fifteenth aspect, the protruding structure is formed on the second conductor portion to extend around the outer periphery of the second electrode, and protrudes further on the side of the surface of the second conductor portion than a periphery thereof on the mounting substrate.

Regarding the light emitting device of a twenty-second aspect, in the twenty-first aspect, on the LED chip, the second electrode is larger than the first electrode, and the protruding structure is formed on the second conductor portion so as to extend entirely around the outer periphery of the second electrode.

Regarding the light emitting device of a twenty-third aspect, in the twenty-first or twenty-second aspect, the protruding structure is formed from an identical material to the part of the second conductor portion that is joined to the second joint portion, and is joined to the second joint portion.

Regarding the light emitting device of a twenty-fourth aspect, in the twenty-first or twenty-second aspect, the protruding structure has a lower solder wettability than the second conductor portion, and is not joined to the second joint portion.

Regarding the light emitting device of a twenty-fifth aspect, in any one of the fifteenth to twenty-fourth aspects, AuSn is used as the solder forming the first joint portion and the solder forming the second joint portion.

Regarding the light emitting device of a twenty-sixth aspect, in any one of the fifteenth to twenty-fifth aspects, a first conductor portion side end of the second conductor portion is set further back than a first electrode side end of the second electrode in order to make the interval between the first conductor portion and the second conductor portion wider than the interval between the first electrode and the second electrode.

Regarding the light emitting device of a twenty-seventh aspect, in the fifteenth aspect, the protruding structure is formed on the second conductor portion to extend around the outer periphery of the second electrode, and protrudes further on the side of the surface of the second conductor portion than a periphery thereof on the mounting substrate. The mounting substrate includes, in addition to a first protruding structure constituted by the protruding structure, a second protruding structure that surrounds the first joint portion. The second protruding structure protrudes from the surface of the first conductor portion so as to contact the LED chip.

Regarding the light emitting device of a twenty-eighth aspect, in the twenty-seventh aspect, the insulating film covers a region on the surface of the first conductive semiconductor layer in which the first electrode is not formed. A tip end surface of the second protruding structure contacts a surface of the insulating film in a part thereof formed on a periphery of the first electrode.

Regarding the light emitting device of a twenty-ninth aspect, in the twenty-sixth or twenty-seventh aspect, AuSn is used as the solder forming the first joint portion and the solder forming the second joint portion.

The invention claimed is:
1. A light emitting device, comprising:
a mounting substrate; and
an LED chip mounted on the mounting substrate,
wherein the mounting substrate includes
a support; and
a first conductor portion and a second conductor portion that are supported by the support such that the LED chip is electrically connected thereto,
wherein the LED chip includes
a substrate;
a first conductive semiconductor layer formed on a side of a first surface of the substrate;
a second conductive semiconductor layer formed on an opposite side of the first conductive semiconductor layer to the substrate;
a first electrode formed on a surface of the first conductive semiconductor layer that is exposed to an opposite side to the substrate; and
a second electrode formed on a surface of the second conductive semiconductor layer,
wherein the light emitting device further includes
a protruding structure, which is conductive, that protrudes from a bottom surface of the surface of the second conductive semiconductor layer toward a side of a top surface of the second conductor portion so as to directly contact the surface of the second conductor portion, and is positioned so as to extend around an outer periphery of the second electrode,
the first electrode and the first conductor portion are joined to each other by a first joint portion formed from solder,
the second electrode and the second conductor portion are joined to each other by a second joint portion formed from solder,
in the LED chip, the second electrode is larger than the first electrode,
the protruding structure is formed to extend entirely around the outer periphery of the second electrode,
the second joint portion is formed so as to fill a space surrounded by the second electrode, the protruding structure, and the second conductor portion,
the protruding structure is disposed to extend around the outer periphery of the second electrode so as to surround the second joint portion in planar view, the second joint portion is in contact with the protruding structure over an entire inner circumference of the protruding structure, and the mounting substrate has a surface facing the LED chip, the surface having a first part and a second part, the first part overlapping the protruding structure in a thickness direction of the LED chip, the first part having a first height from the support, the second part of the surface being jointed to the second joint portion, the second part having a second height from the support, and the first height being equal or lower than the second height.

2. The light emitting device according to claim 1, wherein only the first joint portion is interposed between the LED chip and the first conductor portion in the thickness direction of the LED chip.

3. A light emitting device, comprising:
a mounting substrate; and
an LED chip mounted on the mounting substrate,
wherein the mounting substrate includes
a support; and
a first conductor portion and a second conductor portion that are supported by the support such that the LED chip is electrically connected thereto,
wherein the LED chip includes
a substrate;
a first conductive semiconductor layer formed on a side of a first surface of the substrate;
a second conductive semiconductor layer formed on an opposite side of the first conductive semiconductor layer to the substrate;
a first electrode formed on a surface of the first conductive semiconductor layer that is exposed to an opposite side to the substrate; and
a second electrode formed on a surface of the second conductive semiconductor layer,
wherein the light emitting device further includes
a protruding structure, which is conductive, that protrudes from a bottom surface of the surface of the second conductive semiconductor layer toward a side of a top surface of the second conductor portion so as to directly contact the surface of the second conductor portion, and is positioned so as to extend around an outer periphery of the second electrode,
the first electrode and the first conductor portion are joined to each other by a first joint portion formed from solder,
the second electrode and the second conductor portion are joined to each other by a second joint portion formed from solder,
in the LED chip, the second electrode is larger than the first electrode,
the protruding structure is formed to extend entirely around the outer periphery of the second electrode,
the second joint portion is formed so as to fill a space surrounded by the second electrode, the protruding structure, and the second conductor portion,
the protruding structure is disposed to extend around the outer periphery of the second electrode so as to surround the second joint portion in planar view, and
the mounting substrate has a surface facing the LED chip, the surface having a first part and a second part, the first part overlapping the protruding structure in a thickness direction of the LED chip, the first part having a first height from the support, the second part of the surface being jointed to the second joint portion, the second part having a second height from the support, and the first height being equal or lower than the second height, wherein the protruding structure is formed to extend around the outer periphery of the second electrode of the LED chip, and the protruding structure protrudes further on the side of the surface of the second conductive semiconductor layer than a central portion of the surface of the second electrode on the LED chip.

4. The light emitting device according to claim 1, wherein on the mounting substrate, respective thicknesses of the first conductor portion and the second conductor portion are greater than an interval between the central portion of the surface of the second electrode and a central portion of the surface of the second conductor portion.

5. The light emitting device according to claim 1, wherein the LED chip further includes an insulating film formed on the surface of the second conductive semiconductor layer so as to surround a contact region of the second electrode in which the second electrode contacts the second conductive semiconductor layer,
the second electrode is formed to extend over the surface of the second conductive semiconductor layer and a surface of the insulating film, and
an outer peripheral portion of the second electrode, which protrudes beyond a central portion thereof in a direction heading away from the second conductive semiconductor layer, doubles as the protruding structure.

6. The light emitting device according to claim 1, wherein AuSn is used as the solder forming the first joint portion and the solder forming the second joint portion.

7. The light emitting device according to claim 1, wherein an interval between the first conductor portion and the second conductor portion is wider than an interval between the first electrode and the second electrode.

8. The light emitting device according to claim 7, wherein a first conductor portion side end of the second conductor portion is set further back than a first electrode side end of the second electrode in a direction of the second conductor portion separating from the first conductor portion in order to make the interval between the first conductor portion and the second conductor portion wider than the interval between the first electrode and the second electrode.

9. The light emitting device according to claim 1, wherein the second joint portion includes, in addition to a part thereof formed from solder, a barrier layer formed on the surface of the second conductor portion, the barrier layer functioning as a diffusion barrier,
the barrier layer of the second joint portion is formed on an inner side of the protruding structure and apart from the protruding structure, and
the part of the second joint portion formed from solder is formed to cover a part of the surface of the second conductor portion in which the barrier layer is not formed, as well as a front surface and respective side faces of the barrier layer.

* * * * *